United States Patent
Chen et al.

(10) Patent No.: US 11,688,633 B2
(45) Date of Patent: Jun. 27, 2023

(54) PASSIVATION LAYER FOR INTEGRATED CIRCUIT STRUCTURE AND FORMING THE SAME

(71) Applicant: TAIWAN SEMICONDUCTOR MANUFACTURING CO., LTD., Hsinchu (TW)

(72) Inventors: Chun-Chiang Chen, Hsinchu (TW); Chun-Ting Wu, Kaohsiung (TW); Ching-Hou Su, Hsinchu (TW); Chih-Pin Wang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 153 days.

(21) Appl. No.: 17/378,566

(22) Filed: Jul. 16, 2021

(65) Prior Publication Data

US 2021/0343587 A1 Nov. 4, 2021

Related U.S. Application Data

(63) Continuation of application No. 16/744,014, filed on Jan. 15, 2020, now Pat. No. 11,069,562.

(51) Int. Cl.
*H01L 21/768* (2006.01)
*H01L 23/522* (2006.01)
*H01L 21/02* (2006.01)
*H01L 23/00* (2006.01)

(52) U.S. Cl.
CPC .. *H01L 21/76832* (2013.01); *H01L 21/02274* (2013.01); *H01L 21/76834* (2013.01); *H01L 23/5226* (2013.01); *H01L 24/11* (2013.01); *H01L 24/13* (2013.01); *H01L 2224/02381* (2013.01); *H01L 2224/0401* (2013.01); *H01L 2224/13024* (2013.01)

(58) Field of Classification Search
CPC ............... H01L 21/76832; H01L 24/13; H01L 21/76834; H01L 24/11; H01L 23/5226; H01L 21/02274; H01L 2224/13024; H01L 2224/0401; H01L 2224/02381
See application file for complete search history.

(56) References Cited

U.S. PATENT DOCUMENTS

| | | | |
|---|---|---|---|
| 8,659,170 | B2 | 2/2014 | Kuo |
| 2008/0026568 | A1* | 1/2008 | Standaert ......... H01L 21/76805 438/622 |
| 2013/0193548 | A1 | 8/2013 | Kim |
| 2013/0248952 | A1 | 9/2013 | Rosenbaum |
| 2015/0200140 | A1 | 7/2015 | Beyer |
| 2017/0316830 | A1 | 11/2017 | Su et al. |
| 2019/0109097 | A1 | 4/2019 | Breuer et al. |
| 2019/0252317 | A1 | 8/2019 | Lu et al. |

* cited by examiner

*Primary Examiner* — Karen Kusumakar
(74) *Attorney, Agent, or Firm* — Maschoff Brennan

(57) ABSTRACT

An integrated circuit (IC) structure includes a substrate, a transistor, an interconnect structure, a plurality of metal lines, an oxide liner, a passivation layer, and a nitride layer. The transistor is on the substrate. The interconnect structure is over the transistor. The metal lines is on the interconnect structure. The oxide liner is over the plurality of metal lines. The passivation layer is over the oxide liner and is more porous than the passivation layer. The nitride layer is over the passivation layer.

20 Claims, 22 Drawing Sheets

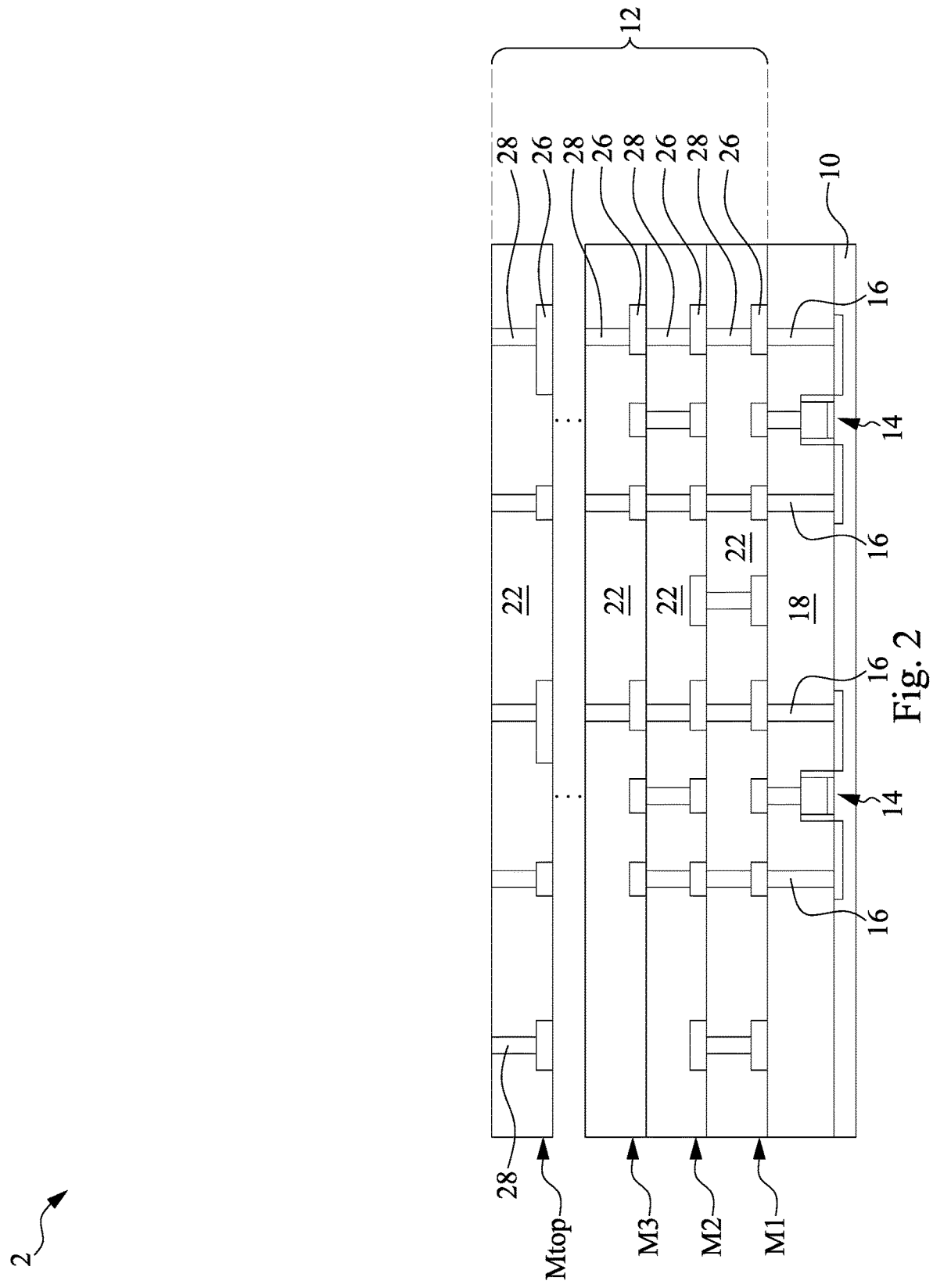

PASSIVATION LAYER FOR INTEGRATED CIRCUIT STRUCTURE AND FORMING THE SAME

RELATED APPLICATIONS

The present application is a continuation application of U.S. application Ser. No. 16/744,014, filed Jan. 15, 2020, now U.S. Pat. No. 11,069,562, issued Jul. 20, 2021, which is herein incorporated by reference in their entirety.

BACKGROUND

To reduce the resistance of metal lines, Ultra-Thick Metal (UTM) lines are formed in integrated circuits. With the reduced resistance, the performance of integrated circuit devices, such as inductors, may be improved to satisfy certain performance demanding circuits such as mixed-signal circuits, analog circuits, and radio frequency (RF) circuits. The UTM lines may be covered with a passivation layer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-13 are cross-sectional views of a method for manufacturing an integrated circuit structure with passivation layers at various stages in accordance with some embodiments of the present disclosure.

DETAILED DESCRIPTION

Figure 1A:
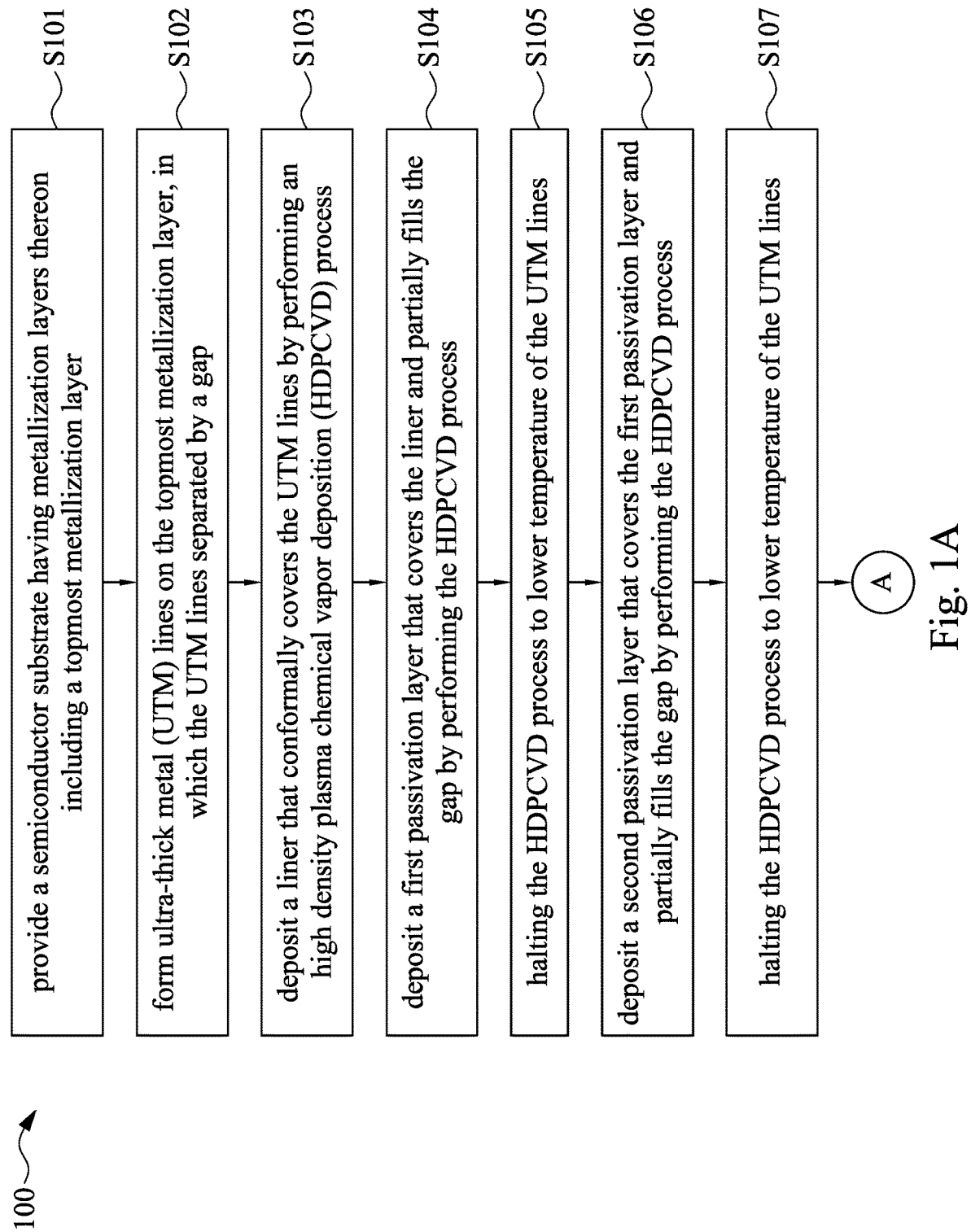
FIGS. 1A and 1B is a flowchart of a method for manufacturing an integrated circuit (IC) structure with a passivation layer in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
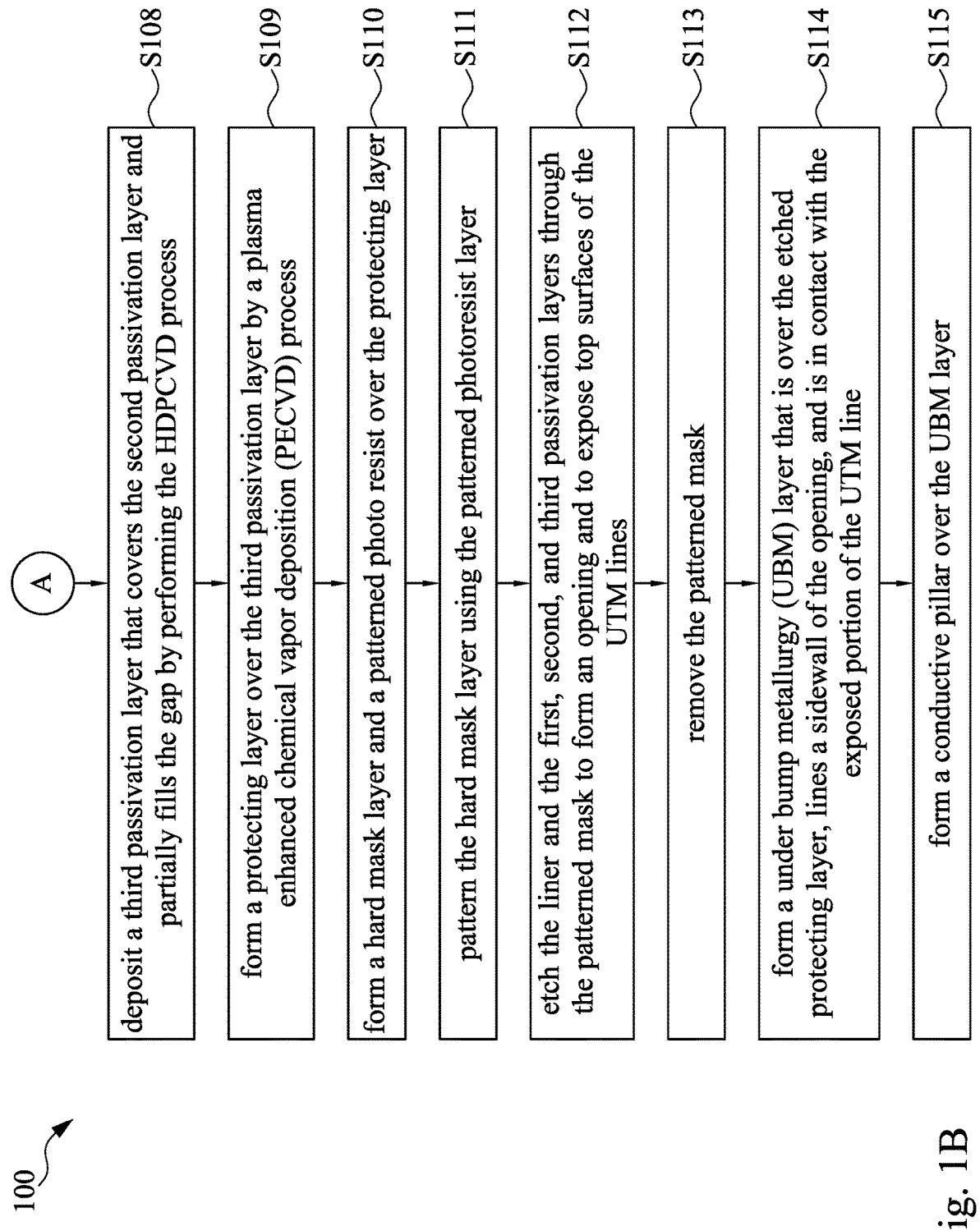

FIGS. 1A and 1B are flowcharts of a method for manufacturing an integrated circuit structure with a passivation layer in accordance with some embodiments of the present disclosure. The method 100 includes a relevant part of the entire manufacturing process. Additional operations can be provided before, during, and after the method 100, and some operations described can be replaced, eliminated, modified, moved around, or relocated for additional embodiments of the method. One of ordinary skill in the art may recognize other examples of semiconductor fabrication processes that may benefit from aspects of the present disclosure. The method 100 is an example, and is not intended to limit the present disclosure beyond what is explicitly recited in the claims.

The method 100 is described below in conjunction with FIGS. 2-13 in which an integrated circuit structure 200 is fabricated by using the method 100. FIGS. 2-13 are cross-sectional views of a method for manufacturing a wafer 2 (may be also referred to as a substrate) with passivation layers at various stages in accordance with some embodiments of the present disclosure. The method 100 begins at block S101 where a semiconductor substrate of a wafer having metallization layers thereon are provided, in which the metallization layer includes a topmost metallization layer. Referring to FIG. 2, a wafer 2 includes a substrate 10. In some embodiments, the substrate 10 is a semiconductor substrate, such as a silicon substrate, although it may include other semiconductor materials, such as silicon germanium, silicon carbide, gallium arsenide, or the like. Semiconductor devices 14, which are symbolized using transistors, may be formed at a surface of the substrate 10. In alternative embodiments, the substrate 10 is a dielectric substrate, and no active devices are formed on the dielectric substrate, although passive devices such as capacitors, inductors, resistors, and the like may be formed. Contact plugs 16 are formed in an inter-layer dielectric (ILD) layer 18, and may be electrically coupled to the devices 14 (e.g., coupled to source/drain regions and gate electrodes of transistors).

Figure 3:
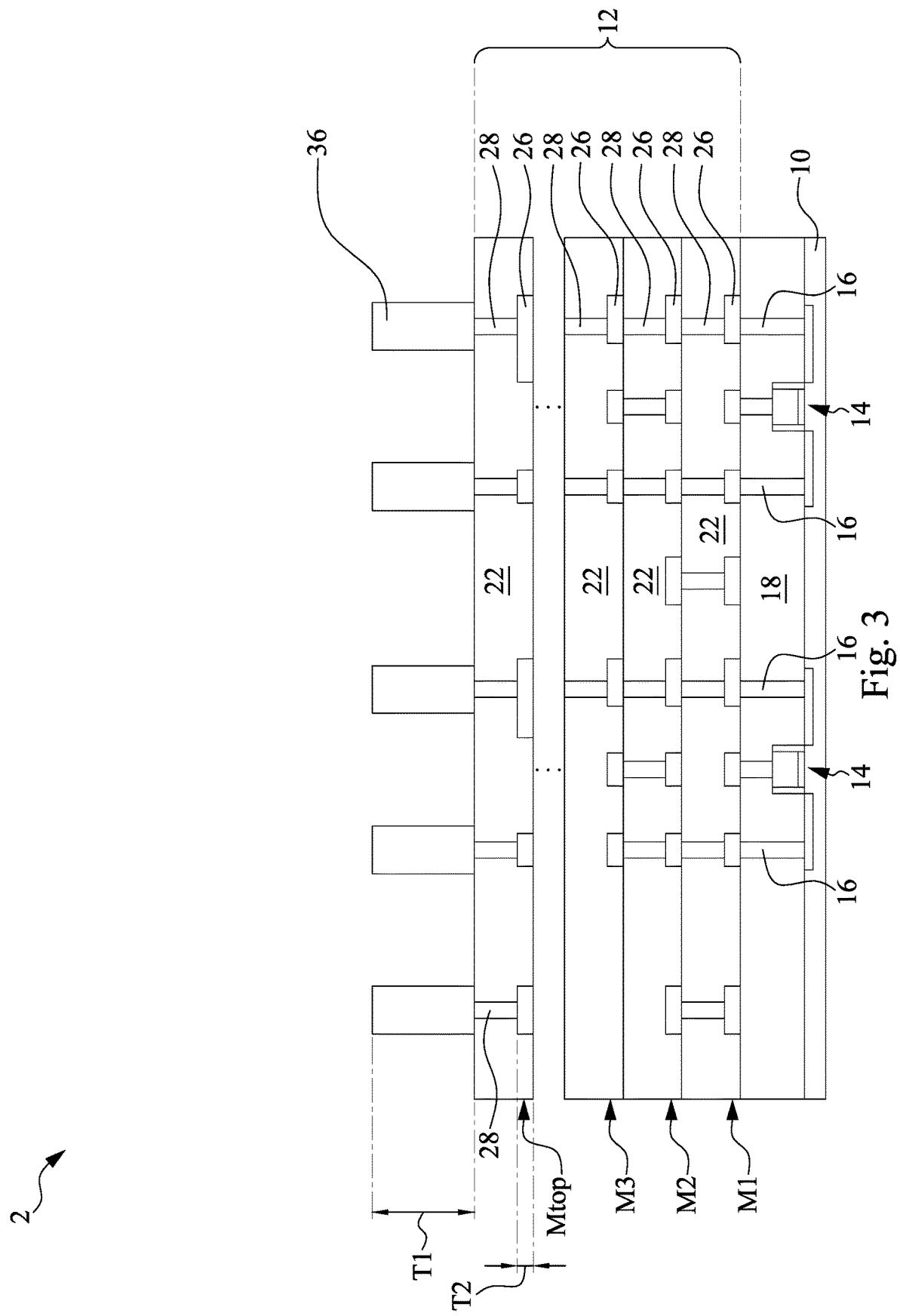

An interconnect structure 12, which includes metal lines 26 and vias 28 therein and electrically coupled to the semiconductor devices 14, is formed over the ILD layer 18. The metal lines 26 and the vias 28 may be formed of substantially pure copper (for example, with a weight percentage of copper being greater than about 90 percent, or greater than about 95 percent) or copper alloys, and may be formed using the single and/or dual damascene processes. The metal lines 26 and the vias 28 may be substantially free from aluminum in some embodiments. The interconnect structure 12 includes a plurality of metal layers, namely M1, M2, M3 . . . Mtop, wherein metal layer M1 is the metal layer immediately above the ILD layer 18, while metal layer Mtop is the top metal layer that is immediately under the subsequently formed UTM lines 36 as shown in FIG. 3. Throughout the description, the term "metal layer" refers to the collection of the metal lines in the same layer. Metal layers M1 through Mtop are formed in inter-metal dielectric (IMD) layers 22, which may be formed of oxides such as Un-doped Silicate Glass (USG), Fluorinated Silicate Glass (FSG), low-k dielectric materials, or the like. The low-k dielectric materials may have k values lower than 3.8, although the dielectric materials of the IMDs layers 22 may also be close to 3.8. In some embodiments, the k values of the low-k dielectric materials are lower than about 3.0, and may be lower than about 2.5.

In the following discussed embodiments, the top metal layer Mtop may be metal layer M6 which is the sixth metal layer above the ILD layer 18, although in other embodiments, a metal layer higher than or lower than M6 may be the Mtop layer. Furthermore, in exemplary embodiments, metal layer M1 may have a thickness between about 2.0 kilo-Angstroms (kÅ) and about 3.5 kÅ, and metal layer layers M2 through Mtop may have thicknesses between about 3.0 kA and about 4.0 kÅ. It is realized, however, that the dimensions of the metal layers recited throughout the description are merely examples, and may be changed in alternative embodiments.

Returning to FIG. 1A, the method 100 then proceeds to block S102 where ultra-thick metal (UTM) lines form on the topmost metallization layer, in which the UTM lines separated by a gap. With reference to FIG. 3, an UTM lines 36 may be formed of aluminum, aluminum copper, or the like, although other materials such as copper, tungsten, nickel, palladium, or the like may also be used or added. Thickness T1 of UTM lines 36 may be significantly greater than thickness T2 of the Mtop layer. In some embodiments, by way of example and not limitation, a ratio T1/T2 is greater about 5. By way of example and not limitation, a ratio T1/T2 may also be between about 6 and about 14. By way of example and not limitation, the thickness T1 of UTM lines 36 may be greater than about 20 kA (hence referred to as ultra-thick metal lines). The UTM lines 36 may have longitudinal axes extending in and out of the page in the cross-sectional view as shown in FIG. 3. The formation process of the UTM lines 36 may include blanket depositing a thick metal layer, and then patterning the thick metal layer using suitable photolithography and etching techniques, and the remaining portions of the thick metal layer form the UTM lines 36.

Figure 4:
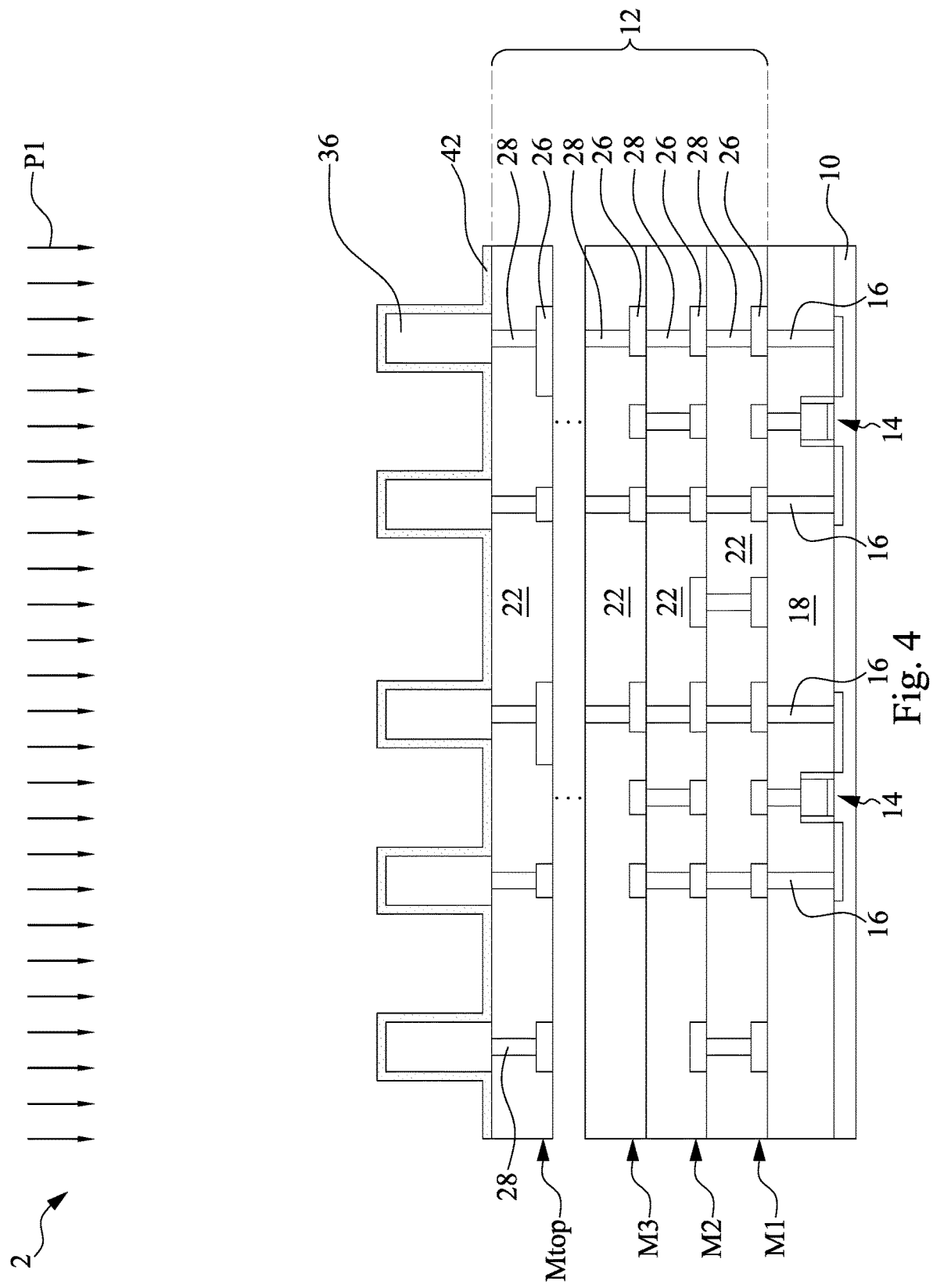

Returning to FIG. 1A, the method 100 then proceeds to block S103 where a liner is deposited to conformally cover the UTM lines. With reference to FIG. 4, a liner layer 42 is conformally formed over the UTM lines 36 and covers the top surface and sidewalls of the UTM lines 36. In some embodiments, the liner layer 42 is in contact with top surfaces and sidewalls of the UTM lines 36. Furthermore, the liner layer 42 extends into the space between neighboring UTM lines 36, and is in contact with a top surface of the IMD layer 22. The formation methods of the liner layer 42 include suitable deposition methods such high-density plasma (HDP) chemical vapor deposition (CVD) process P1, although other applicable deposition methods may also be used.

Figure 19:
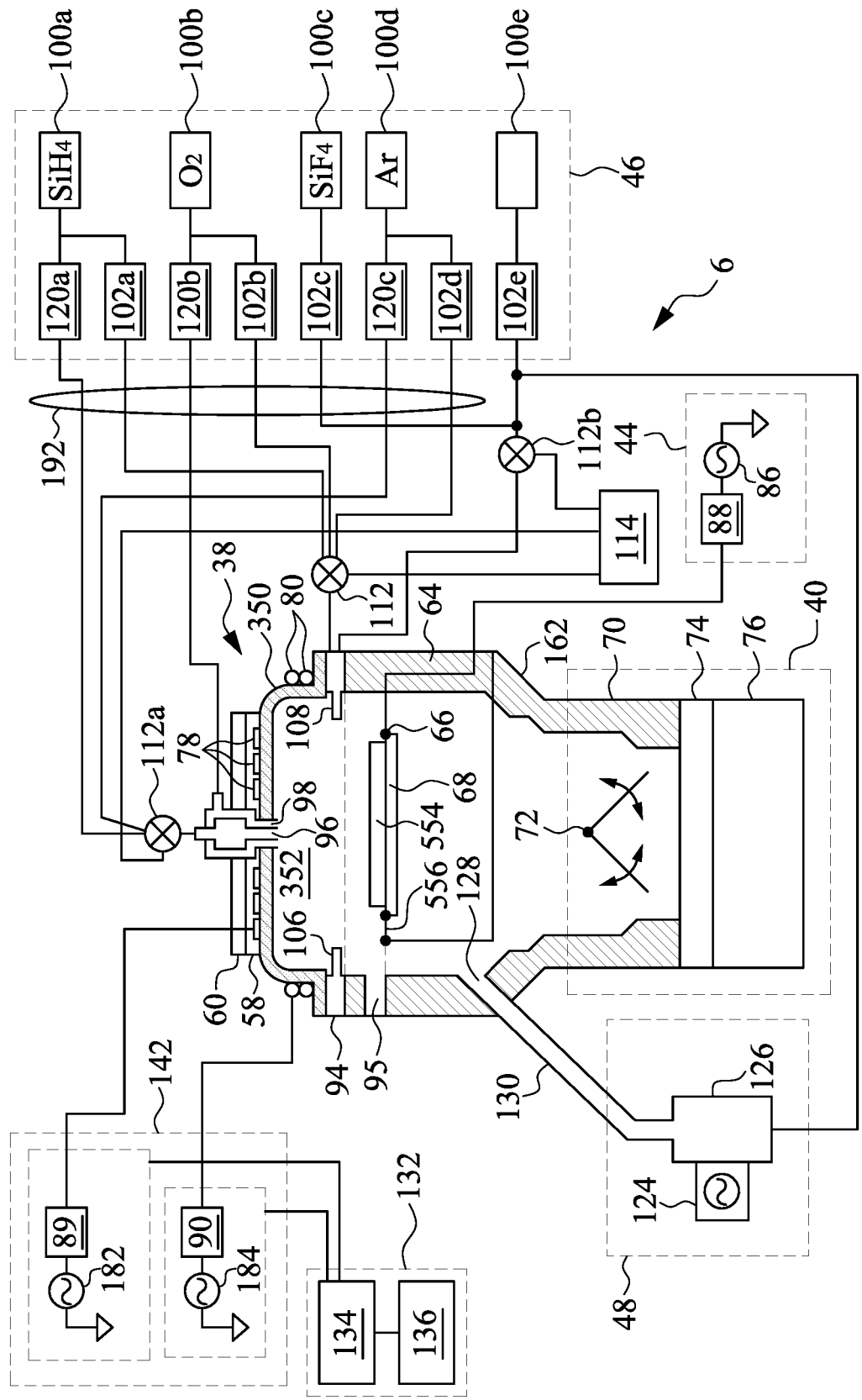
FIG. 19 is a simplified diagram of a high density plasma chemical vapor deposition (HDPCVD) system in accordance with some embodiments of the present disclosure.

FIG. 19 illustrates an example HDP tool that is able to perform the HDPCVD process P1 in accordance with some embodiments of the present disclosure. In some embodiments, a RF power is applied to a top coil 78 shown in FIG. 19 to form a high-density plasma. This plasma pre-heats the wafer 2 prior to deposition. During this step, heat may optionally be applied to the backside of the wafer 2 with a heater in the wafer support or with a susceptor that adsorbs heat from the plasma or external heat source, such as a heat lamp, and transfers it to the wafer 2.

Referring to both FIGS. 4 and 19, the method of the present disclosure may be employed to deposit dielectric layers over the substrate 10 of the wafer 2 positioned in the HDPCVD system 6 shown in FIG. 19. The wafer 2 is positioned in the process chamber 38 proximate to the plasma processing region 352. An inert gas, such as argon gas, is flowed into the process chamber 38. After the inert gas is introduced into the process chamber 38, a plasma is struck. Then, a deposition gas is introduced into the process chamber 38. The deposition gas consists of, for example, a silicon source gas, such as silane gas, $SiH_4$, and an oxygen source gas, such as molecular oxygen gas, $O_2$.

During the deposition, the flow rate of argon of the HDPCVD process P1 is, for example, in the range of 40-120 sccm. The flow rate of the silane gas of the HDPCVD process P1 is, for example, in the range of 40-120 sccm, and the oxygen gas of the HDPCVD process P1 is flowed into the process chamber 38 at a flow rate, for example, in the range of 80-250 sccm. By way of example and not limitation, the plasma is formed by turning on the top RF source generators 182 with a frequency between about 1.8 MHz and about 2.2 MHz and a RF power level between about 12 and about 16 W/cm$^2$, and by turning on the side RF source generator 184 with a frequency between about 12 MHz and about 16 MHz and a RF power level between about 7 to about 13. Notably, the RF bias generator 86 coupled to the wafer chuck 68 is turned off during the HDPCVD process P1, which in turn will reduce a downward force exerting on the plasma, thus preventing unwanted damages on the UTM lines caused by downward plasma strikes. Stated another way, the liner layer 42 is deposited using the HDPCVD process P1 with a zero RF bias power, so as to protect the UTM lines from excessive plasma strikes.

In some embodiments, the liner layer 42 is formed of a dielectric material(s). In some embodiments, the liner layer 42 includes silicon oxide, although other types of oxide materials and nitride materials may be used. The liner layer 42 may also be formed of materials other than oxides and/or nitrides, and may be a homogeneous layer or a composite layer including sub layers formed of different materials. In some embodiments, a thickness of the liner layer 42 is in a range from about 500 Å to about 2000 Å. An excessively thin liner layer 42 may lead to aggravated damages on UTM lines 36. An excessively thick liner layer 42 may lead to excessive overhangs formed in one or more subsequently formed passivation layers.

As illustrated in FIG. 19, the HDPCVD system 6 includes, for example, a process chamber 38, a vacuum system 40, a source plasma system 142, a bias plasma system 44, a gas delivery system 46, and a remote microwave-generated plasma cleaning system 48. An upper portion of process chamber 38 includes a dome 350, which is made of a dielectric material, such as alumina or aluminum nitride. The dome 350 may be an upper boundary of a plasma processing region 352. The plasma processing region 352 is bounded on the bottom by the upper surface of substrate 554 and the substrate support member 556.

A heater plate 58 and a cold plate 60 surmount, and are thermally coupled to, the dome 350. The heater plate 58 and the cold plate 60 allow control of the dome temperature to within about ±10° C. over a desired temperature range. This allows optimizing the dome temperature for the various processes.

The lower portion of process chamber 38 includes a body member 162, which joins the process chamber to the vacuum system. A base portion 64 of the substrate support member 556 is mounted on, and forms a continuous inner surface with, body member 162. Substrates are transferred into and out of process chamber 38 by a robot blade (not shown) through an insertion/removal opening 95 in the side of process chamber 38. A motor (not shown) raises and lowers a lift-pin plate (not shown) that raises and lowers lift pins (not shown) that raise and lower the wafer. Upon transfer into process chamber 38, a substrate is loaded onto the raised lift pins, and then lowered to a substrate receiving portion 66 of substrate support member 556. Substrate receiving portion 66 includes an electrostatic chuck 68 that secures the substrate to substrate support member 556 during substrate processing.

The vacuum system 40 includes a throttle body 70, which houses twin blade throttle valve 72 and is attached to a gate valve 74 and turbomolecular pump 76. It is noted that throttle body 70 offers minimum obstruction to gas flow, and allows symmetric pumping. The gate valve 74 can isolate the pump 76 from the throttle body 70, and can also control process chamber pressure by restricting the exhaust flow capacity when throttle valve 72 is fully open. The arrangement of the throttle valve 72, gate valve 74, and a turbo molecular pump 76 allow accurate and stable control of process chamber pressures from about 1 to 100 millitorr.

The source plasma system 142 includes a top coil 78 and side coil 80, mounted on dome 350. A symmetrical ground shield (not shown) reduces electrical coupling between the coils. The top coil 78 is powered by top RF source generator 182, while the side coil 80 is powered by a side RF source generator 184, allowing independent power levels and frequencies of operation for each coil. This dual coil system allows control of the radial ion density in process chamber 38, thereby improving plasma uniformity. Side coil 80 and top coil 78 couple energy into the chamber 38 inductively. In some embodiments, the top RF source generator 182 provides up to about 2500 W of RF power at nominally about 2 MHz and the side RF source generator 184 provides up to about 5000 W of RF power at nominally about 2 MHz. The operating frequencies of the top and side RF generators may be offset from the nominal operating frequency (e.g., to about 1.7 to about 1.9 MHz and about 1.9 to about 2.1 MHz, respectively) to improve plasma-generation efficiency.

The RF generators 182 and 184 include digitally controlled synthesizers and operate over a frequency range from about 1.7 to about 2.1 MHz. Each generator includes an RF control circuit (not shown) that measures reflected power from the process chamber and coil back to the generator, and adjusts the frequency of operation to obtain the lowest reflected power, as understood by a person of ordinary skill in the art. RF generators may be designed to operate into a load with a characteristic impedance of about 50Ω. RF power may be reflected from loads that have a different characteristic impedance than the generator. This can reduce power transferred to the load. Additionally, power reflected from the load back to the generator may overload and damage the generator. Because the impedance of a plasma may range from less than about 5Ω to over about 900Ω, depending on the plasma ion density among other factors, and because reflected power may be a function of frequency, adjusting the generator frequency according to the reflected power increases the power transferred from the RF generator to the plasma and protects the generator. Another way to reduce reflected power and improve efficiency is with a matching network.

Matching networks 89 and 90 match the output impedance of generators 182 and 184 with coils 78 and 80, respectively. The RF control circuit may tune both matching networks by changing the value of capacitors within the matching networks to match the generator to the load as the load changes. The RF control circuit may tune a matching network when the power reflected from the load back to the generator exceeds a certain limit. One way to provide a constant match, and effectively disable the RF control circuit from tuning the matching network, is to set the reflected power limit above any expected value of reflected power. This may help stabilize a plasma under some conditions by holding the matching network constant at its most recent condition.

The bias plasma system 44 includes a RF bias generator 86 and a bias matching network 88. The bias plasma system 44 capacitively couples substrate receiving portion 66 to the body member 162, which act as complementary electrodes. The bias plasma system 44 serves to enhance the transport of plasma species created by the source plasma system 142 to the surface of the substrate. In some embodiments, the RF bias generator 86 provides up to 5000 W of RF power at about 10 MHz to about 15 MHz.

Other measures may also help stabilize a plasma. For example, the RF control circuit can be used to determine the power delivered to the load (plasma) and may increase or decrease the generator output power to keep the delivered power substantially constant during deposition of a layer.

The gas delivery system 46 includes a plurality of gas sources 100a, 100b, 100c, 100d and 100e. In some embodiments, the aforementioned gas sources include of silane, molecular oxygen, silicon fluoride and argon, respectively. The gas delivery system 46 provides gases from several sources to the process chamber for processing the substrate via gas delivery lines 192 (some of which are shown). Gases are introduced into the process chamber 38 through a gas ring 94, a top nozzle 96, and a top vent 98. Specifically, gas sources, 100a and 100d, provide gas to top nozzle 96 via flow controllers 120a and 120c, respectively, and gas delivery lines 192. Gas from gas source 100b is provided to gas vent 98 via flow controller 120b. The top nozzle 96 and top vent 98 allow independent control of top and side flows of the gases, which improves film uniformity and allows fine adjustment of the film's deposition and doping parameters. The top vent 98 is an annular opening around the top nozzle 96 through which gas may flow into the process chamber from the gas delivery system.

Gas is provided from each of the aforementioned gas sources to gas ring 94 via flow controller 102a, 102b, 102c, 102d and 102e and gas delivery lines 192. The gas ring 94 has a plurality of gas nozzles 106 and 108 (two of which is shown) that provide a uniform flow of gas over the substrate. Nozzle length and nozzle angle may be changed by changing the gas ring 94. This allows tailoring the uniformity profile and gas utilization efficiency for a particular process within an individual process chamber. In a specific embodiment, the gas ring 94 has a total of twenty-four gas nozzles, twelve first gas nozzles 108 and twelve second gas nozzles 106. In some embodiments, the gas nozzles 108 (one of which is shown), are coplanar with, and shorter than, the second gas nozzles 106.

In some embodiments, flammable, toxic, or corrosive gases may be used. In these instances, it may be desirable to eliminate gas remaining in the gas delivery lines after a deposition. This may be accomplished using a three-way valve, such as valve 112, to isolate process chamber 38 from the delivery line 192, and to vent the delivery line 192 to vacuum a foreline 114, for example. As shown in FIG. 19, other similar valves, such as valves 112a and 112b, may be incorporated on other gas delivery lines. Such three-way valves may be placed as close to the process chamber 38 as practical, to minimize the volume of the unvented gas delivery line (between the three-way valve and the process chamber). Additionally, two-way (on-off) valves (not shown) may be placed between a mass flow controller (MFC) and the process chamber or between a gas source and an MFC.

The remote microwave-generated plasma cleaning system 48 is provided to periodically clean deposition residues from process chamber components. The cleaning system includes a remote microwave generator 124 that creates a plasma from a cleaning gas source 100e, such as fluorine, nitrogen trifluoride, or equivalents, in reactor cavity 126. The reactive species resulting from this plasma are conveyed to the process chamber 38 through cleaning gas feed port 128 via an applicator tube 130. The materials used to contain the cleaning plasma (e.g., the cavity 126 and the applicator tube 130) should be resistant to attack by the plasma. The distance between the reactor cavity 126 and the feed port 128 is kept as short as practical, as the concentration of desirable plasma species may decline with distance from the reactor cavity 126. Generating the cleaning plasma in a remote cavity allows the use of an efficient microwave generator and does not subject process chamber components to the temperature, radiation, or bombardment of the glow discharge that may be present in an in situ plasma. During the cleaning process, or other processes, the gate valve 74 may be closed to isolate the turbomolecular vacuum pump 76 from the process chamber. In this configuration, the foreline 114 provides a process vacuum generated by remote vacuum pumps, which may be mechanical vacuum pumps. Isolating the turbomolecular pump from the process chamber with the gate valve protects the turbomolecular pump from corrosive compounds or other potentially harmful effects resulting from the process chamber clean or other processes.

A system controller 132 regulates the operation of the HDPCVD system 6 and includes a processor 134 in electrical communication therewith to regulate the operations thereof. In some embodiments, the processor 134 is part of a single-board computer (SBC), that includes analog and digital input/output boards, interface boards and stepper motor controller boards. Various components of the HDPCVD system 6 conform to the Versa Modular European (VME) standard, which may be a board, card cage, as well as connector type and dimensions. The VME standard also may be the bus structure as having a 16-bit data bus and a 24-bit address bus. The processor 134 executes system control software, which is a computer program stored in a memory 136, electronically coupled to the processor 134. Any type of memory device may be employed, such as a hard disk drive, a floppy disk drive, a card rack or a combination thereof.

Figure 5:
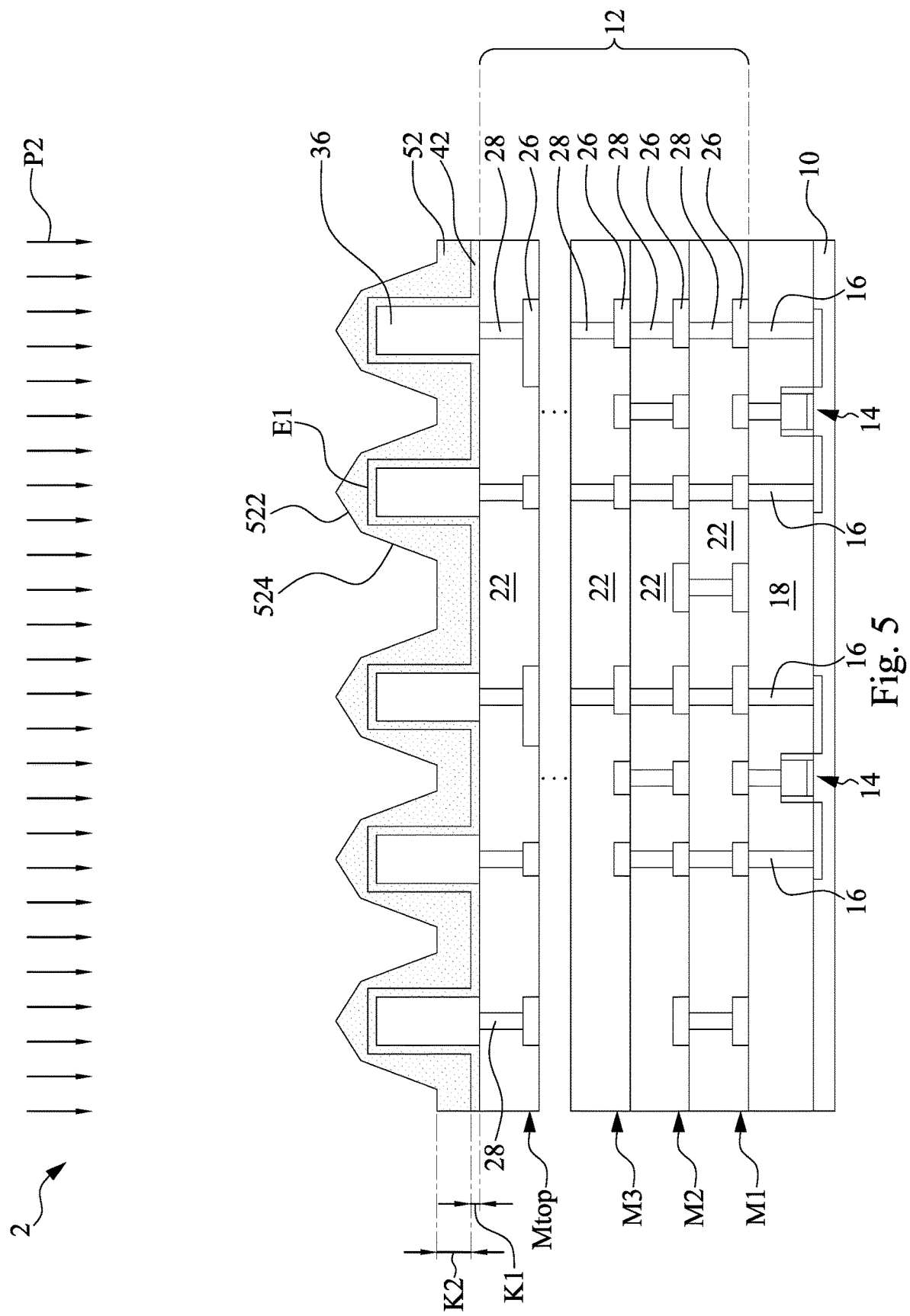

Returning to FIG. 1A, the method 100 then proceeds to block S104 where a first passivation layer is deposited to cover the liner and partially fills the gap between the UTM lines by performing a HDPCVD process. With reference to FIG. 5, a first passivation layer 52 may be deposited on the liner layer 42 by an HDPCVD process P2 shown in FIG. 5. Notably, HDPCVD process P2 can use a non-zero bias power to increase downward plasma strikes upon the deposited passivation material, because liner layer 42 can protect the UTM lines 36 from damages caused by plasma strikes.

Referring to both FIGS. 5 and 19, an inert gas, such as argon gas, is flowed into the process chamber 38. After the inert gas is introduced into the process chamber 38, a plasma is struck. Then, a deposition gas is introduced into the process chamber 38. The deposition gas consists of, for example, a silicon source gas, such as silane gas, $SiH_4$, and an oxygen source gas, such as molecular oxygen gas, $O_2$. During the deposition, the flow rate of argon is in the range of 40-120 sccm. The flow rate of the silane gas, for example, is in the range of 40-120 sccm, and the oxygen gas is flowed into the process chamber at a flow rate, for example, in the range of 80-250 sccm.

During HDPCVD process P2, by way of example and not limitation, the plasma is formed by turning on the top RF source generator 182 as shown in FIG. 19 with a frequency between about 1.8 MHz and about 2.2 MHz and a RF power level between about 12 and about 16 W/cm$^2$, turning on the side RF source generator 184 with a frequency between about 1.8 MHz and 2.2 MHz and a power level between about 12 and about 16 W/cm$^2$, and turning on the RF bias generator 86 with a frequency between about 12 MHz and about 16 MHz and a RF bias power level between about 5 and about 13 W/cm$^2$.

The non-zero bias power allows the HDPCVD process P2 to execute deposition and sputter etch in the meantime. The sputter etch in the HDPCVD process P2 can inhibit overhangs formed on the resulting passivation layer 52 compared with the case where no sputter etch occurs in a HDPCVD process, which in turn improves a gap fill window of one or more following HDPCVD processes (e.g., HDPCVD processes P3 and P4). The sputter etch in the HDPCVD process P2 may result in lower slant facets 524 and upper slant facets 522 formed on the first passivation layer 52, wherein the lower slant facets 524 have steeper slopes than the upper slant facets 522. Slant facets 522 and 524 are formed such that the first passivation layer 52 narrows as it extends away from the underlying interconnect structure 12, thus improving the gap fill window of one or more following HDPCVD processes.

In some embodiments, the first passivation layer 52 is made of a material substantially the same as the liner layer 42. For example, both the first passivation layer 52 and the liner layer 42 are made of silicon oxide ($SiO_2$). Notably, a HDPVCD process with non-zero bias can result in a lower porosity in silicon oxide compared with the case where zero bias is used in a HDPCVD process. As a result, the first passivation layer 52 formed using non-zero bias is less porous than the liner layer 42, although they are both formed from silicon oxide. Because of at least the porosity difference, the first passivation layer 52 and the liner layer 42 may form a distinguishable interface E1 therebetween (e.g., distinguishable in TEM images). In some embodiments, the first passivation layer 52 is porous-free. In some embodiments, a thickness of the first passivation layer 52 is in a range from about 8000 Å to about 20000 Å. In some embodiments, a thickness K2 of the first passivation layer 52 is greater than a thickness K1 of the liner layer 42.

The non-zero RF bias power of the HDPCVD process P2 moves ions within the plasma up and down in relation to the surface of the wafer. It is believed that the wafer support structure acts as one plate of a capacitive coupling structure, while the conductive plasma above the substrate provides the complimentary electrode. Increasing the RF bias power generally increases the sputter etch rate on a horizontal surface, and hence decreases the net deposition rate, in a simultaneous deposition/sputter process.

The plasma density relates to the number of plasma species per unit volume of plasma, which is believed to be primarily a function of the RF source power. A higher plasma density, within limits, provides more plasma species for sputter etching. The RF bias power creates an electric field orthogonal to a surface of the substrate that can accelerate plasma ions into and away from the surface of the substrate. The ions sputter etch the surface of the substrate by physically bombarding the surface. The etch rate of a surface is found to be more sensitive to changes in the RF bias power than to changes in the RF source power. For example, an about 10% change in the RF bias power level changes the sputter etch rate about 10%, when increasing or decreasing the RF bias power. An about 10% change in the RF source power level changes the sputter etch rate less than about 5%. The sputter etch rate is measured on a horizontal wafer surface.

An consideration when depositing the passivation layer 52 using a deposition/sputter technique is maintaining a suitable deposition to sputter (D/S) ratio to prevent either overhangs or over-etching of the passivation layer 52. the D/S ratio may be as follows:

$$D/S=Ds/[Ds-D(S+B)];$$

where D/S is the deposition to sputter ratio, Ds is the deposition rate with the top and side RF sources applied, and D(S+B) is the deposition rate with both the top and side RF sources and the RF bias applied. The range advocated for the D/S ratio may depend upon the largest aspect ratio of the line-to-line spacing between neighboring UTM lines 36.

The D/S ratio may be varied in a number of ways. For example, the D/S ratio may be increased by either increasing the deposition rate at a substantially constant sputter etch rate, or decreasing the sputter etch rate at a substantially constant deposition rate both results in an increased D/S ratio. Conversely, the D/S ratio may be decreased by decreasing the deposition rate at a substantially constant sputter etch rate, or by increasing the sputter etch rate at a substantially constant deposition rate. Varying the RF bias energy also affects the D/S ratio. Specifically, it is believed that by decreasing the RF bias energy, the sputter etch rate is decreased and the deposition rate is increased, thereby increasing the D/S ratio. By increasing the RF bias energy, the D/S ratio may be decreased in an analogous manner.

In some embodiments, the liner layer 42 and the first passivation layer 52 of the wafer 2 are in-situ performed in the same process apparatus (i.e. performed in the process chamber 38 of the HDPCVD system 6).

As used herein, the term "in-situ" is used to describe processes that are performed while a device or substrate remains within a processing system (e.g., including a load lock chamber, transfer chamber, processing chamber, or any other fluidly coupled chamber), and where for example, the processing system allows the substrate to remain under vacuum conditions. As such, the term "in-situ" may also generally be used to refer to processes in which the device or substrate being processed is not exposed to an external environment (e.g., external to the processing system).

Figure 20:
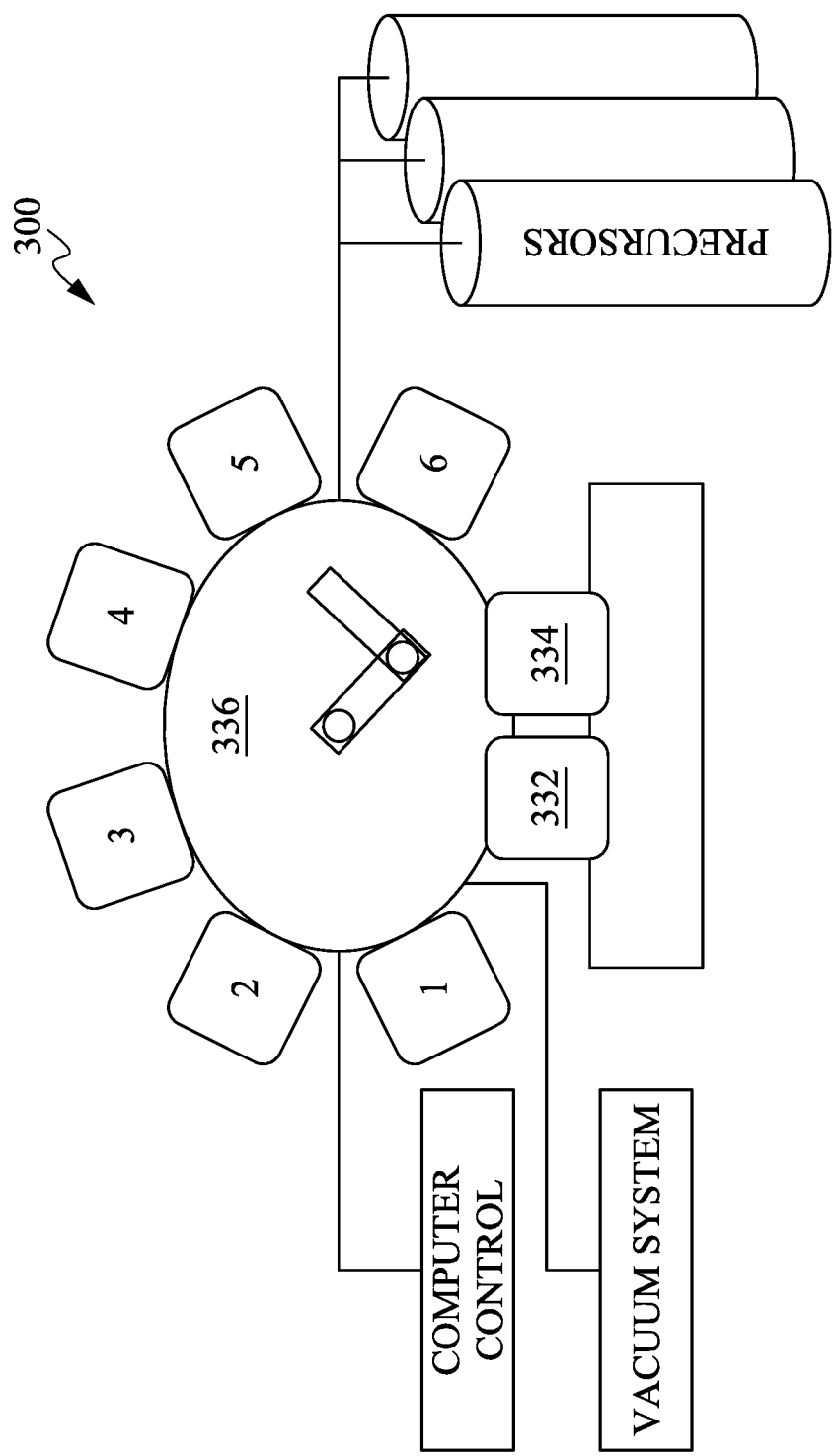
FIG. 20 is a simplified diagram of a cluster tool having multiple single wafer processing clambers mounted thereon in accordance with some embodiments of the present disclosure.
Figure 21:
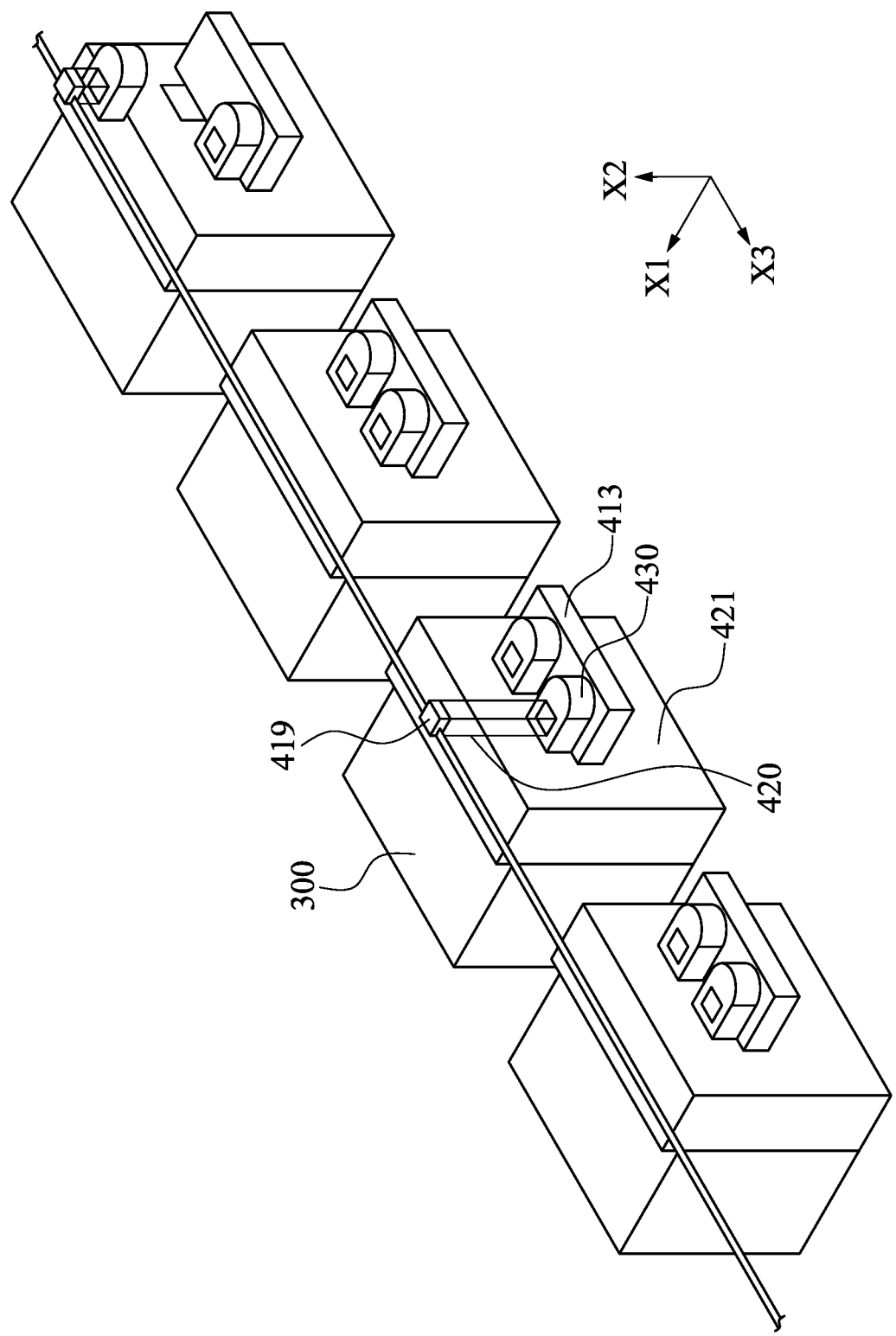
FIG. 21 is a simplified diagram of a perspective view of a production site for describing an automatic transfer method of the FOUP (Front Opening Unified Pod) system among substrate treatment unit.

Returning to FIG. 1A, the method 100 then proceeds to block S105 where the HDPCVD process is optionally halted to lower temperature of the UTM lines. With reference to FIGS. 5, 20, and 21, after the deposition of the first passivation layer 52 by the HDPCVD process P2 shown in FIG. 5, the wafer 2 may be transferred to a wafer handling chamber 336 (may also referred to as a non-process chamber) shown in FIG. 20 from the HDPCVD system 6 to lower temperature of the UTM lines 36. Notably, the liner layer 42 and the first passivation layer 52 may experience different thermal stresses resulting from increased temperature, which may lead to cracks at the interface E1 between the liner layer 42 and the first passivation layer 52. Therefore, the transferring may be used to cool the UTM lines 36, so as to reduce cracks at the interface E1 between the liner layer 42 and the first passivation layer 52.

In some embodiments, the wafer 2 may be transferred to the load lock chamber 332, 334 (may also referred to as a non-process chamber) or to outside the multi-chamber processing system 300 to lower temperature of the UTM lines 36, so as to reduce cracks at the interface E1 between the liner layer 42 and the first passivation layer 52.

In some embodiments, the wafer 2 may be transferred to a treatment unit 421 (may also referred to as a non-process chamber) connected to the multi-chamber processing system 300 or transferred to a FOUP (Front Opening Unified Pod) system 430 to lower temperature of the UTM lines 36. Therefore, cracks at the interface E1 between the liner layer 42 and the first passivation layer 52 can be reduced. In some embodiments, a top surface of the first passivation layer 52 may exposed to an atmospheric environment.

FIG. 20 illustrates a schematic top-view diagram of an exemplary multi-chamber processing system 300. In some embodiments, as shown in FIG. 20, the system 300 may be equivalently referred to as a "cluster tool". The system 300 may generally include load lock chambers 332 and 334, the wafer handling chamber 336, and a plurality of processing system 1-6. In various embodiments, the load lock chambers 332 and 334 provide for the transfer of the wafer 2 into and out of the system 300. In various embodiments, the system 300 is under vacuum, and the load lock chambers 332 and 334 may "pump down" the substrates introduced into the system 300 (e.g., by way of a mechanical pump and/or a turbomolecular pump). In some embodiments, the load lock chambers 332 and 334 may be adapted to receive a single wafer or a plurality of wafers (e.g., loaded into a cassette). By way of example, the load lock chambers 332 and 334 may be separated from the wafer handling chamber 336 by way of a gate valve, allowing the wafer handling chamber 336 to remain under vacuum when one or both of the load lock chambers 332 and 334 are vented.

In various embodiments, the wafer handling chamber 336 is equipped with an automated, robotic arm that may move smoothly along any of a horizontal, vertical, and/or rotational axis so as to transfer substrates between the load lock chambers 332 and 334 and any of the substrate processing chambers 1-6. Each processing chamber 1-6 may be configured to perform a number of substrate processing operations such as atomic layer deposition (ALD), HDPCVD, PVD, etching, pre-treatment/pre-soak, de-gassing, annealing, as well as a number of metrology operations such as XPS analysis, AFM analysis, and/or other suitable processing or metrology operations. In various embodiments, the system 300 may have more or less processing chambers, for example, for a particular process to be performed by the system 300.

In FIG. 21, reference numeral 413 designates a load port; 419 designates an overhead hoist transfer (OHT) section; and 420 designates a hoist mechanism. The load port 413 has an FIMS (front opening interface mechanical standard) structure. The OHT section 419 in FIG. 21 is an automatic transfer machine for use with the FOUP system 430 installed in a bay of a semiconductor factory. Each of the plurality of treatment units 421 arranged in a line is provided with the load port 413. The FOUP system 430 with the wafer 2 which is transferred by use of the hoist mechanism 420.

In some embodiments, the wafer 2 is transported from one treatment system 421 to another while being stored in the FOUP system 430. The automatic transfer machine, such as the OHT section 419, is used for transporting the FOUP system 430 with the wafer 2. In some embodiments, the FOUP system 430 with the wafer 2 is lifted away from the load port 413 of the treatment unit 421, by use of the hoist mechanism 420.

In some embodiments, the FOUP system 430 with the wafer 2 is transported to a cabinet (may also referred to as a non-process chamber) through use of the OHT section 419 and is temporarily stored in the cabinet. In the next processing process (for example, an ashing process or the like), the FOUP system 430 is transported.

With respect to FIG. 21, the FOUP system 430 with the wafer 2 to be treated stored therein is transported, to the treatment unit 421, from the cabinet provided in the course of manufacturing processes, by means of the OHT section 419. The FOUP system 430 with the wafer 2 is lowered onto and placed in a predetermined position (mount position) on the load port 413 of the treatment unit 421, by use of the hoist mechanism 420. The hoist mechanism 420 is disengaged from the FOUP system 430 with the wafer 2, and the FOUP system 430 with the wafer 2 is left on the load port 413. Subsequently, the FOUP system 430 with the wafer 2 is moved forward until it is docked with the load port door 414. The wafer 2 are transported to multi-chamber processing system 300 provided within the treatment unit 421, by means of a wafer transport robot (not shown) provided in the treatment unit 421, wherein the wafers are subjected to a predetermined process, such as one or more HDPCVD processes P1-P4 shown in FIGS. 4-7.

Figure 6:
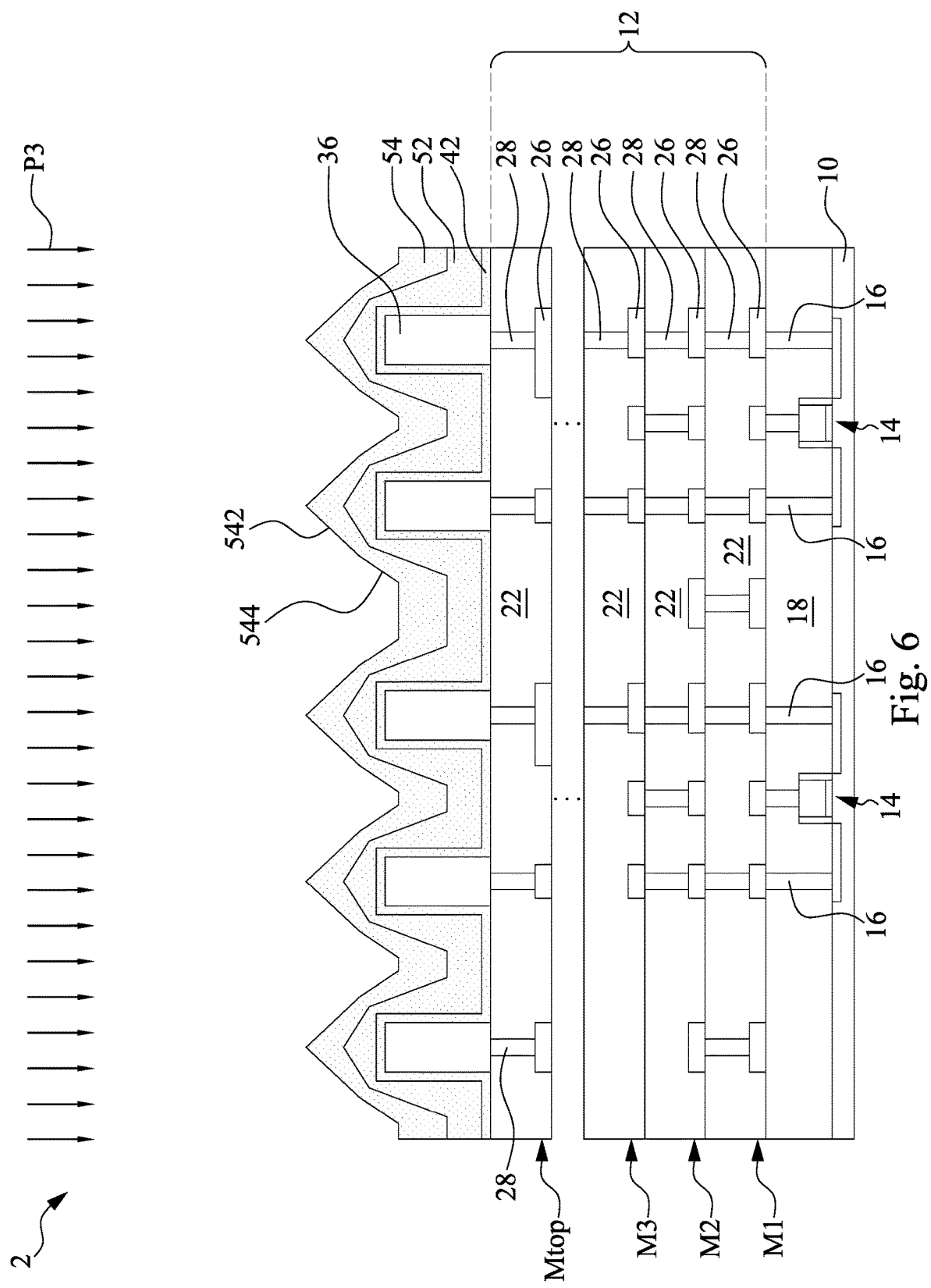

Returning to FIG. 1A, the method 100 then proceeds to block S106 where a second passivation layer is deposited to cover the first passivation layer and partially fills the gap by performing another HDPCVD process. With reference to FIG. 6, a second passivation layer 54 may be deposited by a concurrent deposition/sputter process, such as the HDPCVD process P3 shown in FIG. 6. Notably, HDPCVD process P3 can use a non-zero bias power to increase downward plasma strikes upon the deposited passivation material, because the liner layer 42 and the first passivation layer 52 can protect the UTM lines 36 from damages caused by plasma strikes.

During HDPCVD process P3, by way of example and not limitation, the plasma is formed by turning on the top RF source generator 182 as shown in FIG. 19 that with a frequency between about 1.8 MHz and about 2.2 MHz and a RF power level between about 12 and about 16 W/cm$^2$, tuning on the side RF source generator 184 with a frequency between about 1.8 MHz and about 2.2 MHz and a power level between about 12 and about 16 W/cm$^2$, and tuning on the RF bias generator 86 with a frequency between about 12 MHz and about 16 MHz and a RF bias power level between about 6 and about 14 W/cm$^2$. In some embodiments where the aspect ratio of the line-to-line spacing between UTM lines 36 (i.e., ratio of depth to width) is increased by the first passivation layer 52 (e.g., width reduction of line-to-line spacing caused by the first passivation layer 52 being greater than depth reduction of line-to-line spacing caused by the first passivation layer 52), the non-zero RF bias power of the HDPCVD process P3 can be greater than the non-zero RF bias power of the HDPCVD process P2 to result in greater sputter etch rate in the HDPCVD process P3 than in the HDPCVD process P2. In this way, overhangs of the second passivation layer 54 can be inhibited, even if it is deposited in the line-to-line spacing with increased aspect ratio. In such embodiments, the deposition-to-sputter ratio of the HDPCVD process P3 is less than the deposition-to-sputter ratio of the HDPCVD process P2. On the other hand, if the aspect ratio of the line-to-line spacing between UTM lines 36 is decreased by the first passivation layer 52 (e.g., width reduction of line-to-line spacing being less than depth reduction of line-to-line spacing), the non-zero RF bias power of the HDPCVD process P3 can be less than the non-zero RF bias power of the HDPCVD process P2 to result in greater deposition rate in the HDPCVD process P3 than in the HDPCVD process P2, because the HDPCVD process P3 has relaxed overhang concerns compared to the HDPCVD process P2. In such embodiments, the deposition-to-sputter ratio of the HDPCVD process P3 is greater than the deposition-to-sputter ratio of the HDPCVD process P2.

The non-zero bias power allows the HDPCVD process P3 to execute deposition and sputter etch in the meantime. The sputter etch in the HDPCVD process P3 can inhibit overhangs formed on the resulting passivation layer 54 compared with the case where no sputter etch occurs in a HDPCVD process, which in turn improves a gap fill window of one or more following HDPCVD processes (e.g., HDPCVD process P4). The sputter etch in the HDPCVD process P3 may result in lower slant facets 544 and upper slant facets 542 formed on the second passivation layer 54, wherein the lower slant facets 544 have steeper slopes than the upper slant facets 542. Slant facets 542 and 544 are formed such that the first passivation layer 52 narrows as it extends away from the underlying interconnect structure 12, thus improving the gap fill window of one or more following HDPCVD processes.

In some embodiments, the second passivation layer 54 is made of a material substantially the same as the first passivation layer 52 and have no interface therebetween, because they have comparable porosity (e.g., less porous than liner layer or porous free), such that the second passivation layer 54 and the first passivation layer 52 may experience comparable stress during the manufacturing process, and thus crack between the second passivation layer 54 and the first passivation layer 52 can be prevented. For example, both the second passivation layer 54 and the first passivation layer 52 are made of silicon oxide ($SiO_2$).

In some embodiments, the second passivation layer 54 is made of a material substantially the same as the liner layer 42. For example, both the second passivation layer 54 and the liner layer 42 are made of silicon oxide ($SiO_2$). Notably, a HDPVCD process with non-zero bias can result in a lower porosity in silicon oxide compared with the case where zero bias is used in a HDPCVD process. As a result, the second passivation layer 54 formed using non-zero bias is less porous than the liner layer 42, although they are both formed from silicon oxide. In some embodiments, the second passivation layer 54 is porous-free. In some embodiments, a thickness of the second passivation layer 54 is in a range from about 10000 Å to about 30000 Å. The facets 542 and 544 of the second passivation layer 54 is less vertical compared to the facets 522 and 524 of the first passivation layer 52.

In some embodiments, the second passivation layer 54 and the first passivation layer 52 are in-situ performed in the same process apparatus (i.e. performed in the same HDPCVD system), as discussed previously with respect to FIGS. 19-21. In some embodiments, the second passivation layer 54 and the first passivation layer 52 are ex-situ performed in different HDPCVD systems of the same multi-chamber processing system 300, as discussed previously with respect to FIGS. 19-21. In some embodiments, the second passivation layer 54 and the first passivation layer 52 are ex-situ performed in different HDPCVD systems of the different multi-chamber processing systems, as discussed previously with respect to FIGS. 19-21.

Figure 7:
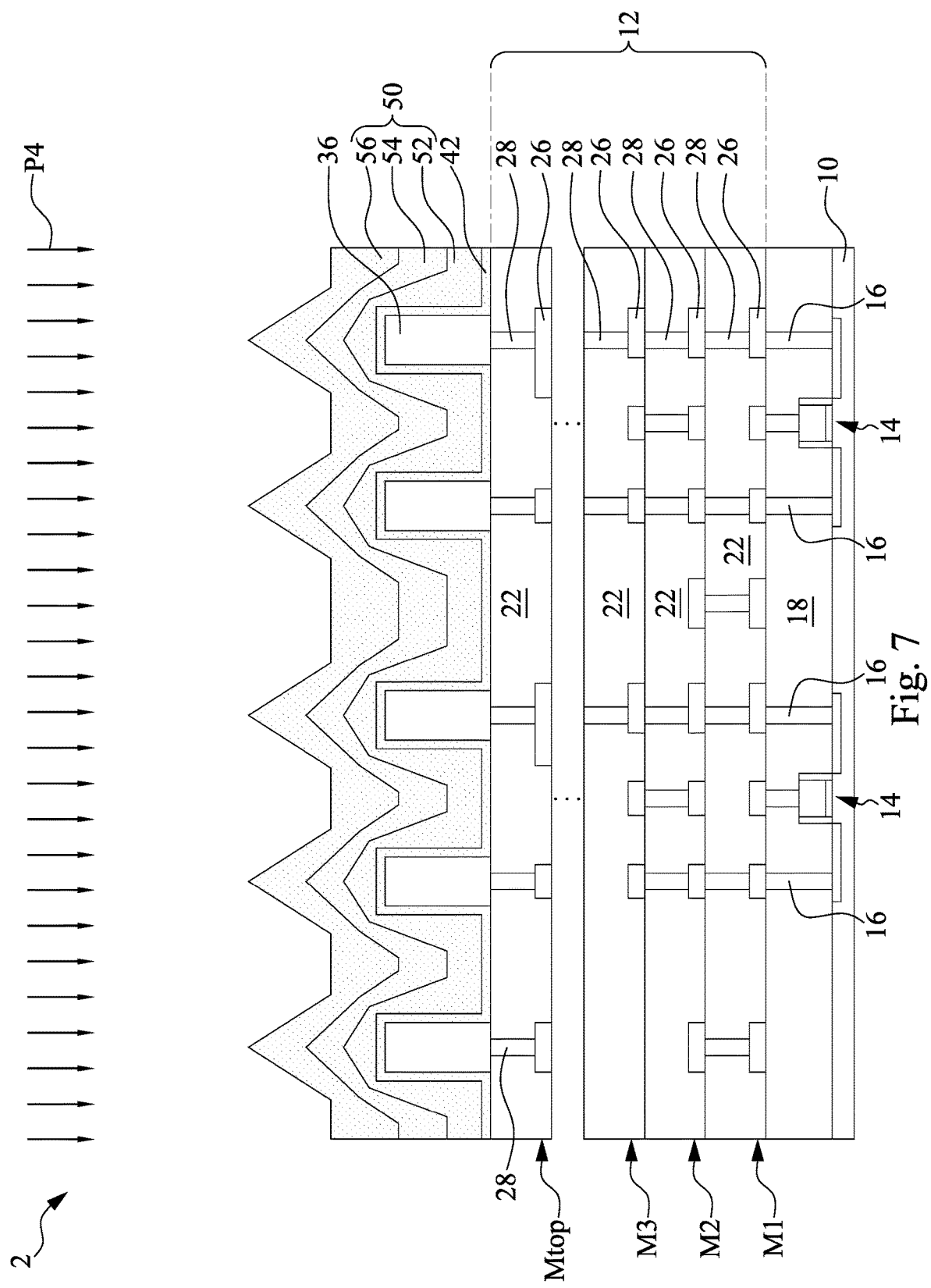

Returning to FIG. 1B, the method 100 then proceeds to block S108 where a third passivation layer is deposited to cover the second passivation layer by performing the HDPCVD process. With reference to FIG. 7, a third passivation layer 56 may be deposited by a concurrent deposition/sputter process, such as an HDPCVD process P4 shown in FIG. 7. Notably, HDPCVD process P4 can use a non-zero bias power to increase downward plasma strikes upon the deposited passivation material, because the liner layer 42, the first passivation layer 52, and the second passivation layer 54 can protect the UTM lines 36 from damages caused by plasma strikes.

During HDPCVD process P4, by way of example and not limitation, the plasma is formed by turning on the RF source generator 182 shown in FIG. 19 that with a frequency between about 1.8 MHz and about 2.2 MHz and a RF power level between about 12 and about 16 W/cm$^2$, tuning on the side RF source generator 184 with a frequency between about 1.8 MHz and about 2.2 and a power level between about 12 and about 16 W/cm$^2$, and tuning on the RF bias generator 86 with a frequency between about 12 MHz and about 16 MHz and a RF bias power level between about 7 and about 15 W/cm$^2$. In some embodiments where the aspect ratio of the line-to-line spacing between UTM lines 36 (i.e., ratio of depth to width) is increased by the second passivation layer 54 (e.g., width reduction of line-to-line spacing caused by the second passivation layer 54 being greater than depth reduction of line-to-line spacing caused by the second passivation layer 54), the non-zero RF bias power of the HDPCVD process P4 can be greater than the non-zero RF bias power of the HDPCVD process P3 to result in greater sputter etch rate in the HDPCVD process P4 than in the HDPCVD process P3. In this way, overhangs of the third passivation layer 56 can be inhibited, even if it is deposited in the line-to-line spacing with increased aspect ratio. In such embodiments, the deposition-to-sputter ratio of the HDPCVD process P4 is less than the deposition-to-sputter ratio of the HDPCVD process P3. On the other hand, if the aspect ratio of the line-to-line spacing between UTM lines 36 is decreased by the second passivation layer 54 (e.g., width reduction of line-to-line spacing being less than depth reduction of line-to-line spacing), the non-zero RF bias power of the HDPCVD process P4 can be less than the non-zero RF bias power of the HDPCVD process P3 to result in greater deposition rate in the HDPCVD process P4 than in the HDPCVD process P3, because the HDPCVD process P4 has relaxed overhang concerns compared to the HDPCVD process P3. In such embodiments, the deposition-to-sputter ratio of the HDPCVD process P4 is greater than the deposition-to-sputter ratio of the HDPCVD process P3.

In some embodiments, the third passivation layer 56 partially fills the gap between the UTM lines 36. In some embodiments, the third passivation layer 56 is made of a material substantially the same as the second passivation layer 54 and have no interface therebetween, because they have comparable porosity (e.g., less porous than liner layer or porous free), such that the third passivation layer 56 and the second passivation layer 54 may experience comparable stress during the manufacturing process, and thus crack between the third passivation layer 56 and the second passivation layer 54 can be reduced. For example, both the third passivation layer 56 and the second passivation layer 54 are made of silicon oxide (SiO$_2$).

In some embodiments, third passivation layer 56 is made of a material substantially the same as the liner layer 42. For example, both the third passivation layer 56 and the liner layer 42 are made of silicon oxide (SiO$_2$). Notably, a HDPVCD process with non-zero bias can result in a lower porosity in silicon oxide compared with the case where zero bias is used in a HDPCVD process. As a result, the third passivation layer 56 formed using non-zero bias is less porous than the liner layer 42, although they are both formed from silicon oxide. In some embodiments, the second passivation layer 54 is porous-free. In some embodiments, a thickness of the third passivation layer 56 is in a range from about 10000 Å to about 30000 Å. In some embodiments, an entirety of the first, second, and third passivation layer 52, 54, and 56 may be referred to as a passivation structure 50. The passivation structure 50 is a continuous oxide material having a homogeneous porosity distribution and thus has no distinguishable interface inside.

In some embodiments, the third passivation layer 56 and the second passivation layer 54 are in-situ performed in the same process apparatus (i.e. performed in the same HDPCVD system). In some embodiments, the third passivation layer 56 and the second passivation layer 54 are ex-situ performed in different HDPCVD systems of the same multi-chamber processing system 300. In some embodiments, the third passivation layer 56 and the second passivation layer 54 are ex-situ performed in different HDPCVD systems of the different multi-chamber processing systems.

Figure 8:
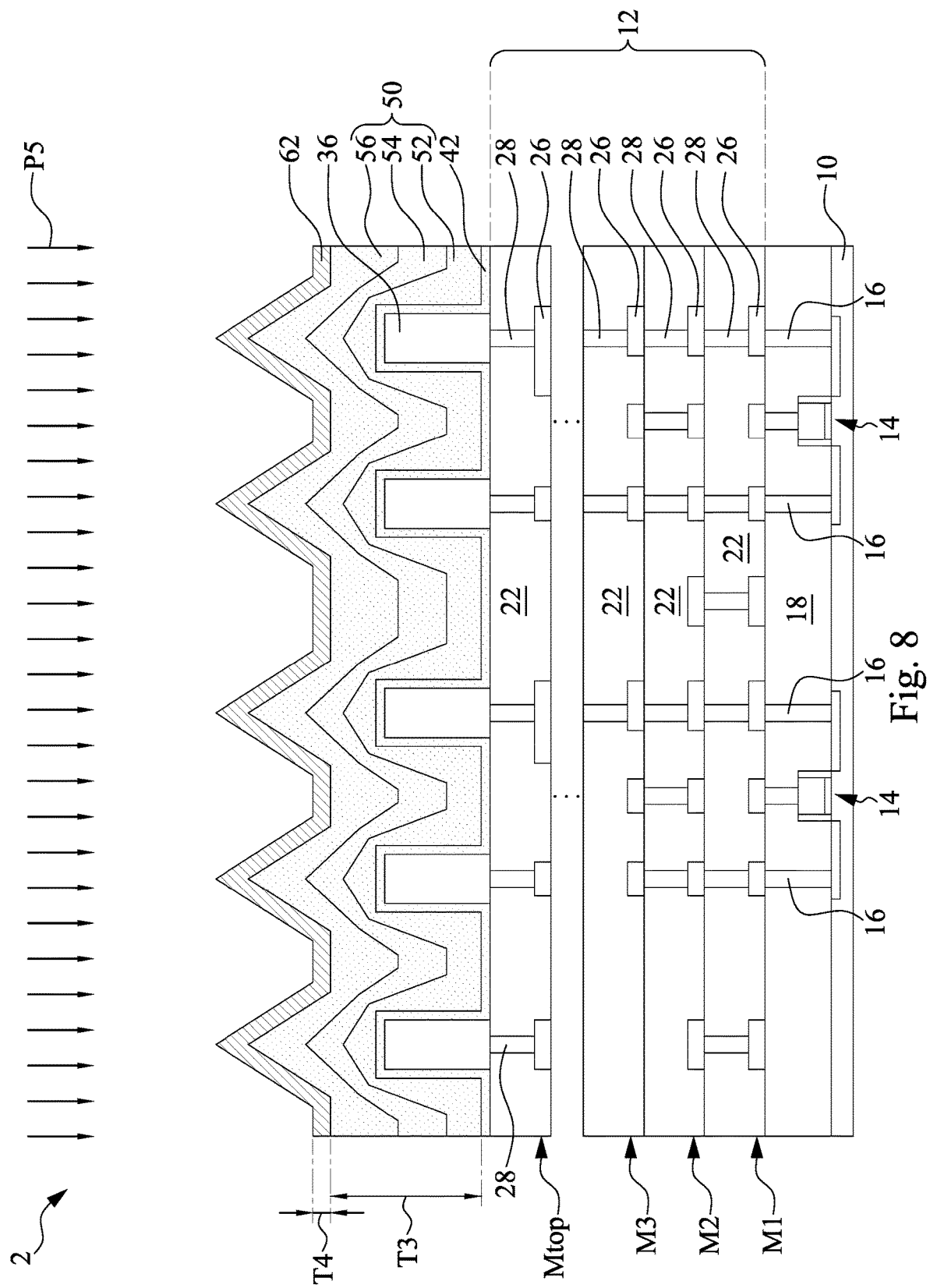

Returning to FIG. 1B, the method 100 then proceeds to block S109 where a protecting layer is formed over the third passivation layer by a plasma enhanced chemical vapor deposition (PECVD) process. With reference to FIG. 8, a protecting layer 62, such as a nitride layer, is conformally deposited over the passivation structure 50 by the PECVD process P5. The protecting layer 62 is deposited by PECVD. The protecting layer 62 may include silicon nitride (SiN) or silicon oxynitride (SiON). The protecting layer 62 prevents or decreases moisture, mechanical, and radiation damage to the integrated circuits. In some embodiments, a thickness T3 of the passivation structure 50 is substantially larger than a thickness T4 of the protecting layer 62. The passivation structure 50 and the protecting layer 62 form a composite passivation layer. The protecting layer 62 is above the top surfaces of the UTM lines 36, thus without filling into the gap (i.e., line-to-line spacing) between the UTM lines 36. In some embodiments, the passivation structure 50 extends continuously without an interface from the liner layer 42 to the protecting layer 62.

Figure 9:
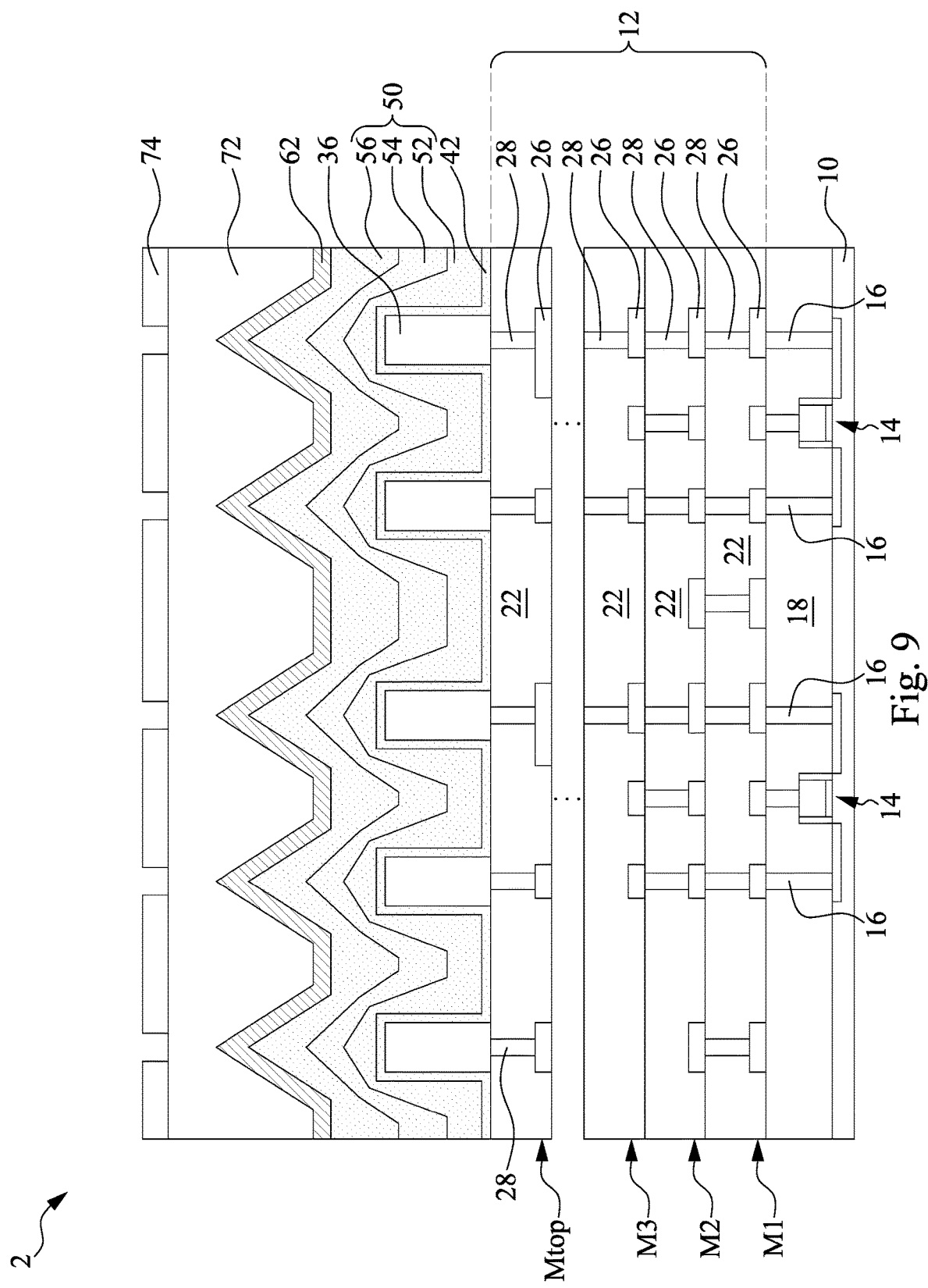

Returning to FIG. 1B, the method 100 then proceeds to block S110 where a hark mask and a patterned photo resist is formed over the protecting layer. With reference to FIG. 9, a hard mask layer 72 and a photoresist layer 74 are sequentially formed on the protecting layer 62. In some embodiments, the hard mask layer 72 includes a material(s) such as amorphous silicon (a-Si), silicon oxide, silicon nitride (SiN), titanium nitride, or another suitable material or composition. In some embodiments, the hard mask layer 72 includes an anti-reflection coating (ARC) layer such as a nitrogen-free anti-reflection coating (NFARC) layer including a material(s) such as silicon oxide, silicon oxygen carbide, or plasma enhanced chemical vapor deposited silicon oxide.

In some embodiments, the photoresist layer 74 is a multi-layer resist formed over the hard mask layer 72. In some embodiments, the photoresist layer 74 is coated on the hard mask layer 72 using a spin-on coating method or any other suitable methods. In some embodiments, the photoresist layer 74 may be a deep UV photoresist that may include polymers having hydroxystyrene groups. In some embodiments, the photoresist layer 74 may be formed from a positive tone photoresist. In some embodiments, the photoresist layer 74 may be formed from a negative tone photoresist. In some embodiments, the photoresist layer 74 includes an i-line photoresist that normally includes a Novolac resin that is prepared by reacting a cresol, xylenol, or other substituted phenols with formaldehyde. In some embodiments, the photoresist layer 180 is a polar component such as a polymer with hydroxyl or phenol groups that can attract or bond with amines or nitrogen containing compounds that might diffuse out of the underlying dielectric materials.

The photoresist layer 74 is exposed by applying a radiation beam (such as an electron-beam). Next, the photoresist layer 74 is developed to form a patterned photoresist layer 74. Specifically, the photoresist layer 74 is patterned based on a received design layout. In some embodiments, the first photoresist layer 74 is patterned using an electron beam (e-beam) writer. Other patterning techniques that may be used in conjunction with or as a replacement for e-beam writing include ion-beam writing and masked and maskless photolithography. Additionally, any other suitable patterning technique may be used. Patterning the photoresist layer may include soft baking, mask aligning, exposure, post-exposure baking, developing the photoresist, rinsing, drying (e.g., hard baking), other suitable processes, and/or combinations thereof.

Figure 10:
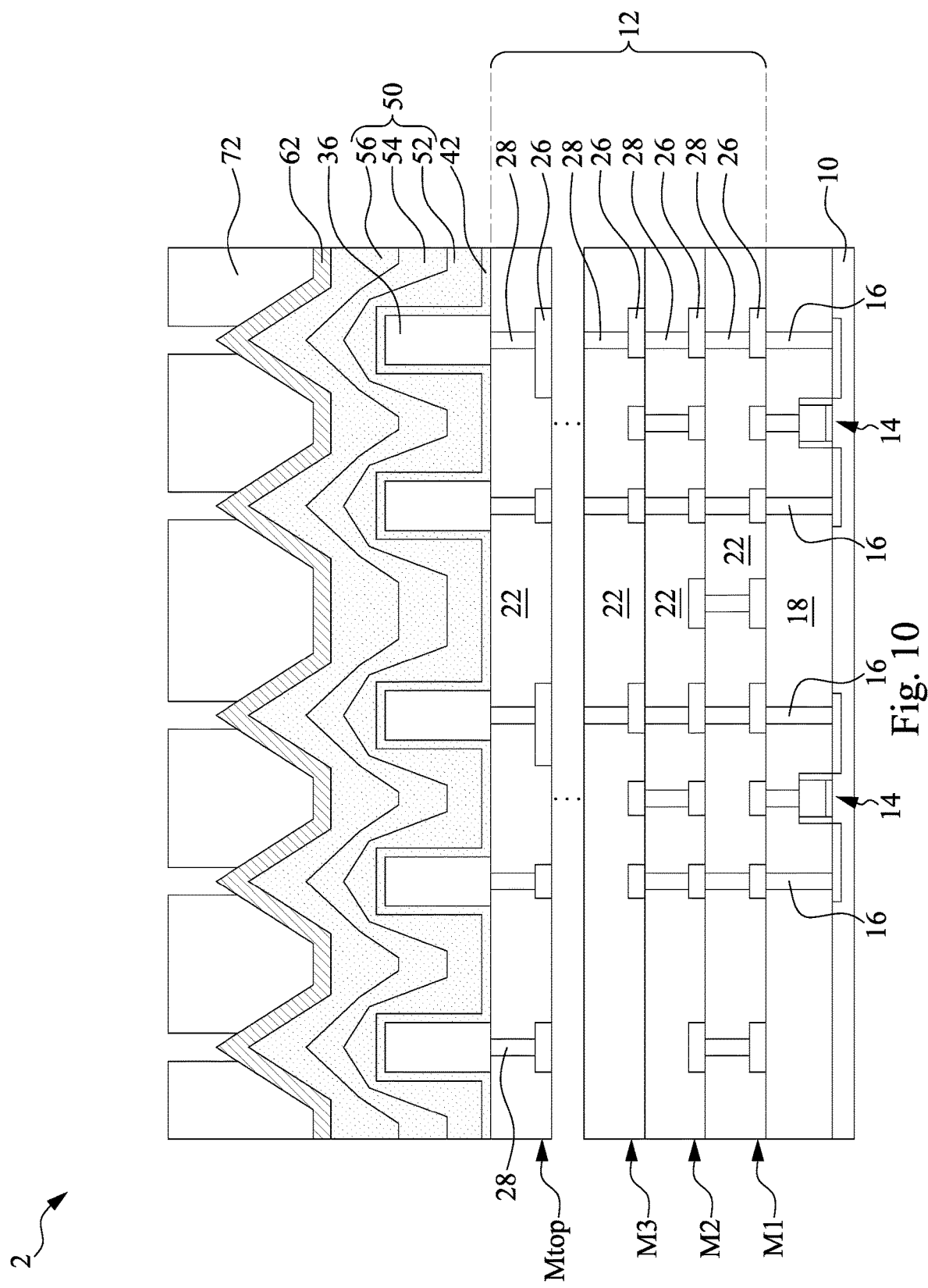

Returning to FIG. 1B, the method 100 then proceeds to block S111 where the hard mask layer is patterned using the patterned photoresist layer as an etch mask. With reference to FIG. 10, the hard mask layer 72 is patterned using the patterned photoresist layer 72 (see FIG. 9) as an etch mask, thereby transferring the pattern of the photoresist layer 74 to the hard mask layer 72. For example, the hard mask layer 72 may be etched using a dry (plasma) etching process, a wet etching process, and/or other etching methods. In some embodiments, the photoresist layer 74 may be partially or completely consumed during the etching of the hard mask layer 72. In some embodiments, any remaining portion of the patterned photoresist layer 74 may be stripped off, leaving the hard mask layer 72 over the protecting layer 62.

Figure 11:
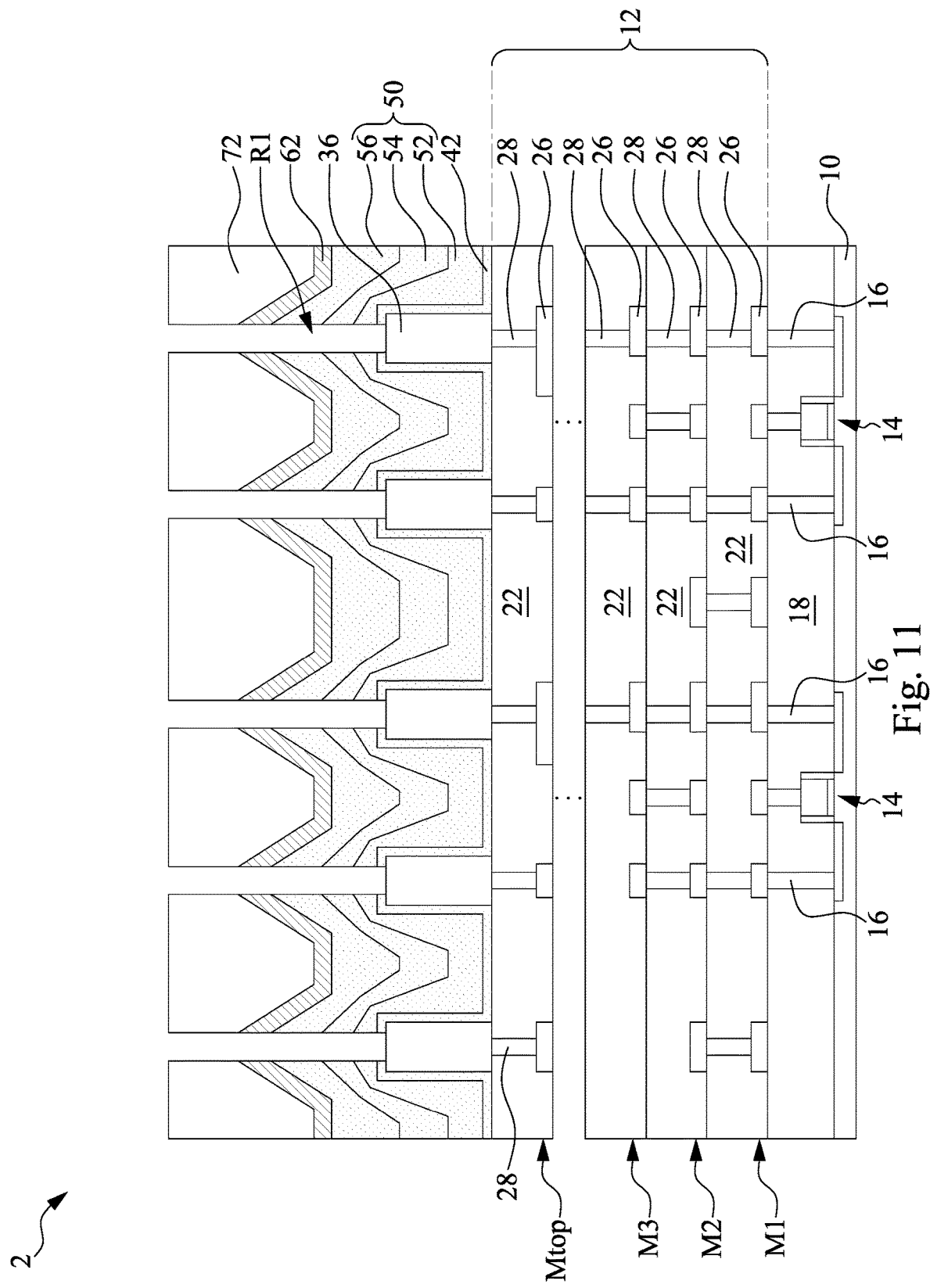

Returning to FIG. 1B, the method 100 then proceeds to block S112 where the liner and the first, second, and third passivation layers are etched through the patterned mask to form recesses R1 and to expose top surfaces of the UTM lines. With reference to FIG. 11, the liner layer 42 and the first, second, and third passivation layers 52, 54, and 56 are patterned. Specifically, the liner layer 42 and the first, second, and third passivation layers 52, 54, and 56 are patterned using the patterned hard mask layer 72 as a mask to form a plurality of recesses R1 therein. This process may be referred to as a pattern transfer, in that the pattern of the hard mask layer 72 is transferred to the liner layer 42 and the first, second, and third passivation layers 52, 54, and 56. In some embodiments, patterning the liner layer 42 and the first, second, and third passivation layers 52, 54, and 56 includes one or more etching processes to selectively remove a portion of the liner layer 42 until the UTM line 36 is exposed. The etching processes may include dry etching, wet etching, and/or other etching methods.

Figure 12:
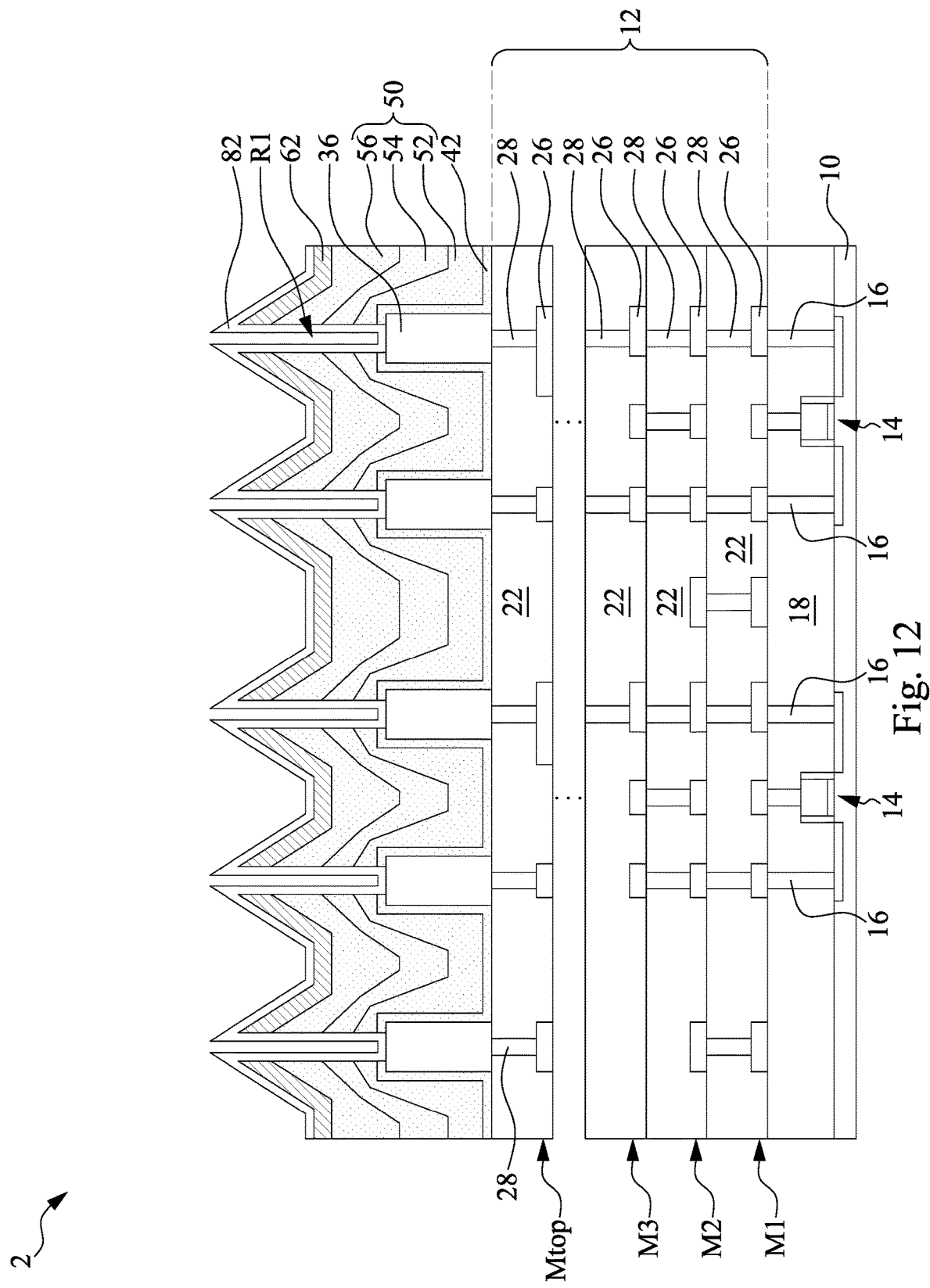

Returning to FIG. 1B, the method 100 then proceeds to blocks S113 and S114 where the patterned mask is removed, and then an under bump metallurgy (UBM) layer is formed over the etched protecting layer, lines a sidewall of the recess R1, and is in contact with the exposed portion of the UTM line. With reference to FIG. 12, in some embodiments of blocks S113 and 114, the hard mask layer 72 (see FIG. 11) is stripped from the protecting layer 62. Then, an under bump metallurgy (UBM) layer 82 is formed over the protecting layer 62 and lines the sidewalls of the recesses R1 and contacts the exposed portion of the UTM line 36. The UBM layer 82, in some embodiments, includes multiple layers of conductive materials, such as a layer of titanium, a layer of copper, and/or a layer of nickel. In some embodiments, each layer in the UBM layer 82 may be formed by using a plating process, such as electrochemical plating, although other processes of formation, such as sputtering, evaporation or electrodeless plating process, may alternatively be used depending upon the materials to be used.

Figure 13:
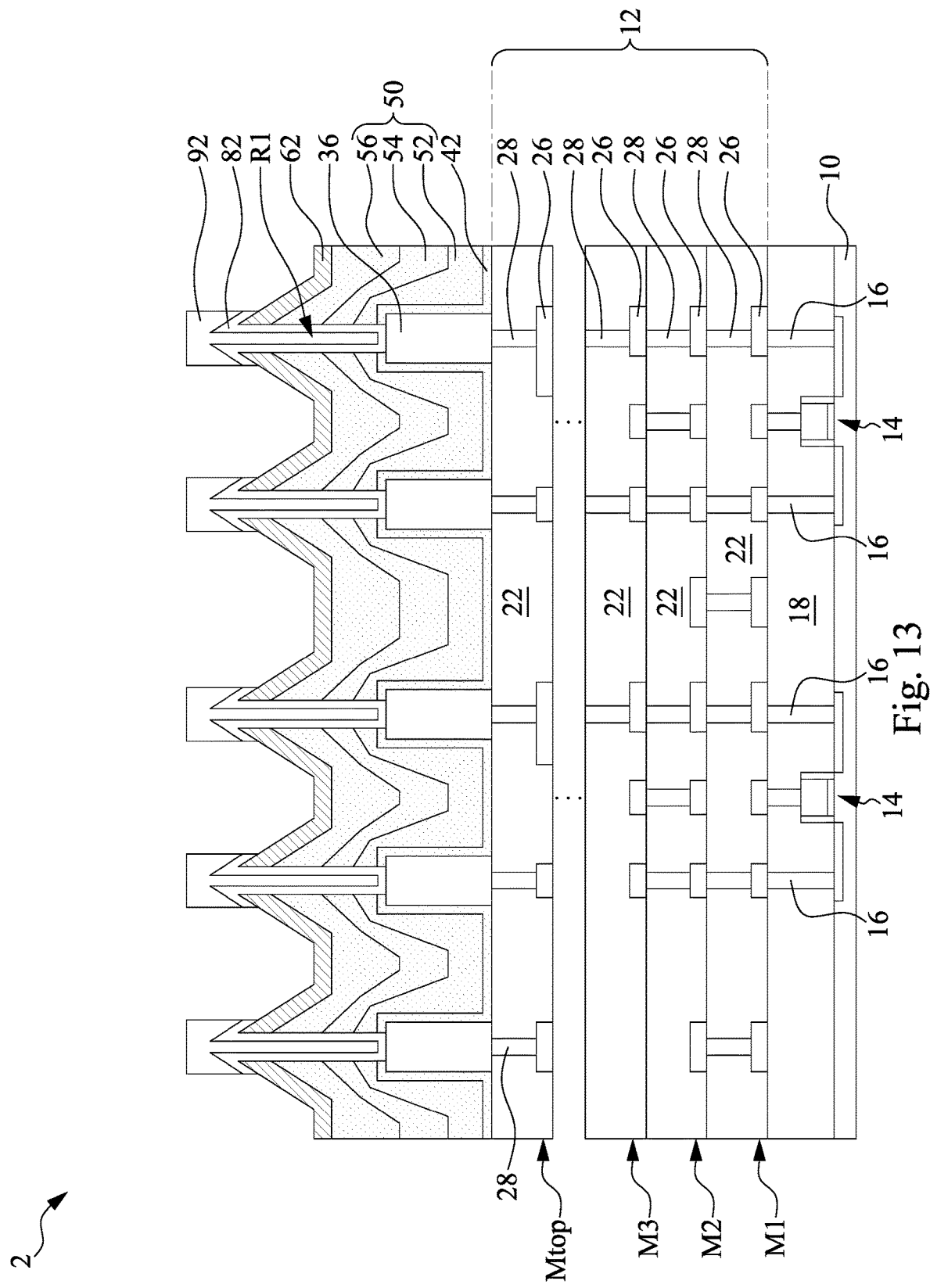

Returning to FIG. 1B, the method 100 then proceeds to block S115 where a conductive pillar is formed over the UBM layer. With reference to FIG. 13, a photoresist layer (not shown) is formed over the UBM layer 82 and developed to form holes that expose the UBM layer 82 in the recesses R1 and over the exposed portions of the UTM line 36. The photoresist layer acts as a mold for metal deposition process for conductive pillar formation. Then, a conductive material is deposited, in some embodiments, in the hole by evaporation, electroplating, or screen printing to form conductive pillar bumps 92 over the UBM layer 82 as shown in FIG. 13. The conductive material includes any of a variety of metals or metal alloys, such as copper.

After the removal of the photoresist layer, the UBM layer 82 not covered by the conductive pillar bump 92 is removed by an etching process that etches the exposed portions of the UBM layer 82 down to the underlying protecting layer 62. The remaining UBM layer 82 under the conductive pillar bump 92 is disposed over the sidewalls of the recesses R1, over a portion of the protecting layer 62, and contacts the exposed portion of the UTM line 36. In some embodiments, the conductive pillar bump 92 is a copper pillar.

Figure 14:
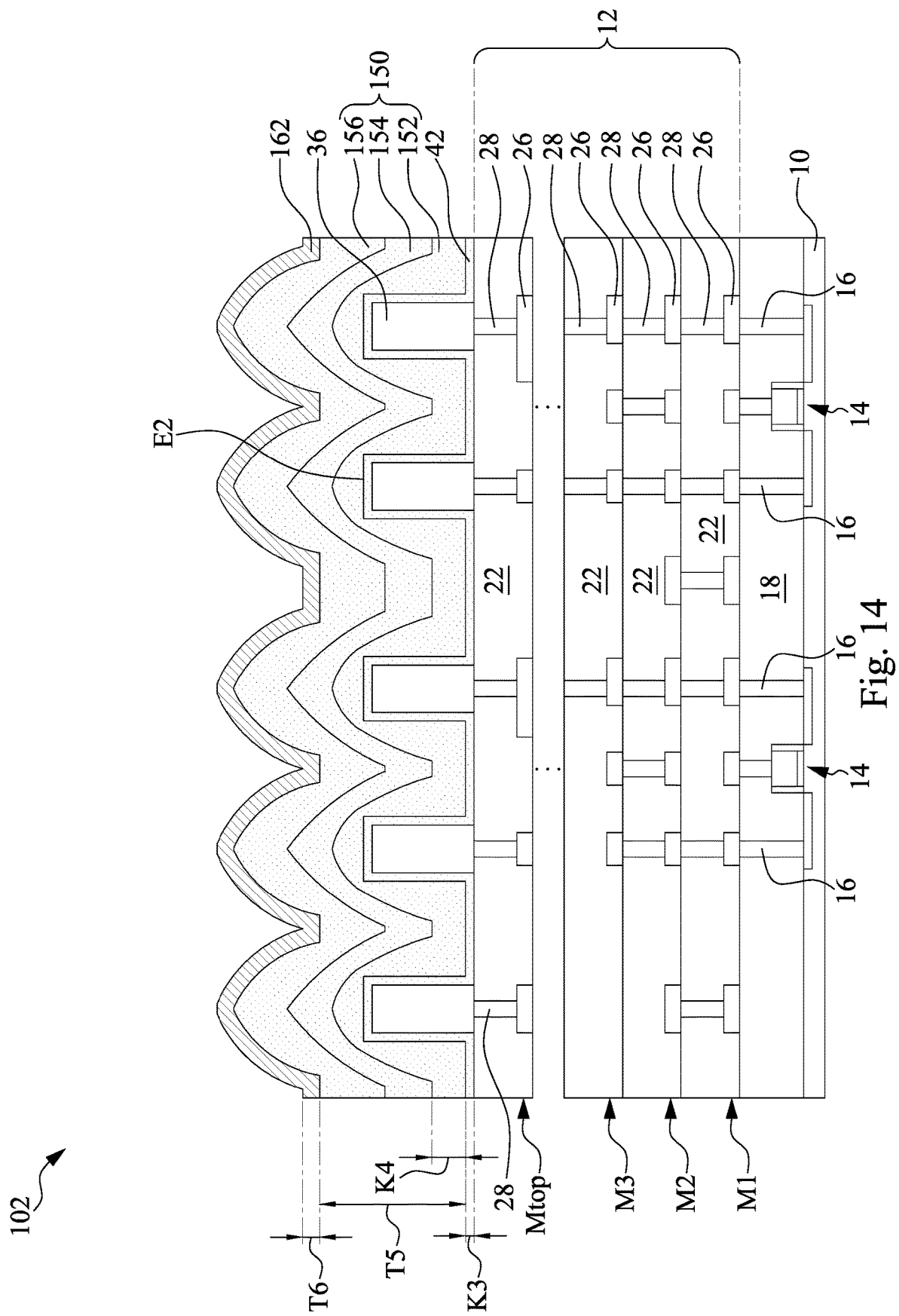
FIGS. 14 and 15 are cross-sectional views of a method for manufacturing an integrated circuit structure with passivation layers at various stages in accordance with some embodiments of the present disclosure.
Figure 15:
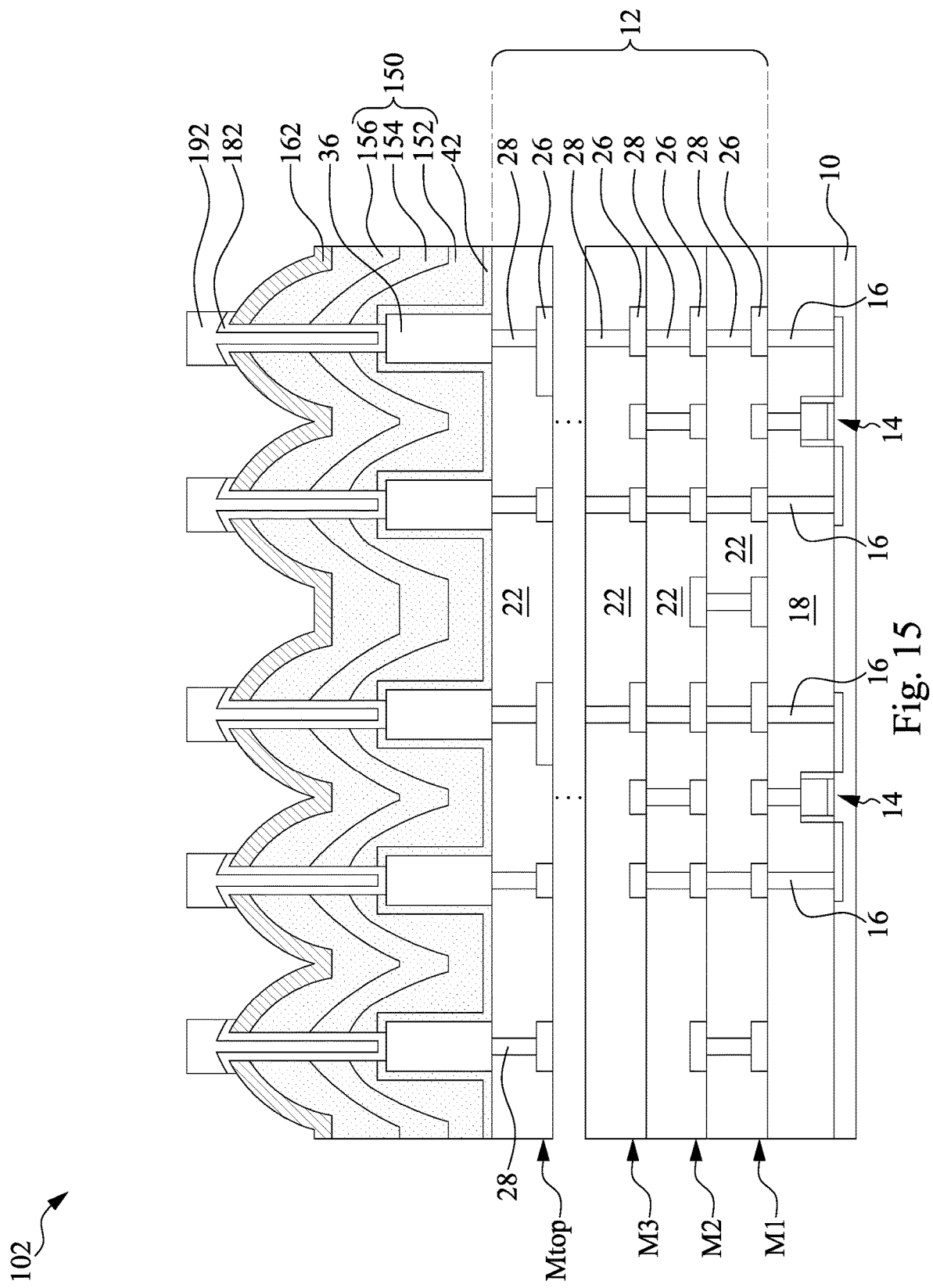

Reference is made to FIGS. 14 and 15. FIGS. 14 and 15 are cross-sectional views of a method for manufacturing an integrated circuit structure with passivation layers at various stages in accordance with some embodiments of the present disclosure. It should be pointed out that operations for forming a wafer 102 with the integrated circuit structure before the structure shown in FIG. 14 are substantially the same as the operations for forming the wafer 2 shown in FIGS. 1A-8, and reference may be made to the foregoing paragraphs for the related detailed descriptions and such descriptions are not provided again herein. The difference between the present embodiment and the embodiment in FIGS. 1-8 is that the first, second, and third passivation layers 152, 154, and 156 and the protecting layer 162 of the present embodiment have different cross-sectional profiles than the first, second, and third passivation layers 52, 54, and 56 and the protecting layer 62 shown in FIGS. 1-8. In some embodiments, an entirety of the first, second, and third passivation layer 152, 154, and 156 may be referred to as a passivation structure 150. In some embodiments, the passivation structure 150 extends without an interface from the liner layer 42 to the protecting layer 162.

As shown in FIG. 14, the first, second, and third passivation layers 152, 154, and 156 and the protecting layer 162 have curved profiles in the cross-sectional view. In some embodiments, a thickness T5 of the passivation structure 150 is substantially larger than a thickness T6 of the protecting layer 162. In some embodiments, the first, second, and third passivation layers 152, 154, and 156 are more porous than the liner layer 42. In some embodiments, the first passivation layer 152 and the liner layer 42 form a distinguishable interface E2 therebetween.

In some embodiments, the liner layer 42 is formed of a dielectric material(s). In some embodiments, a thickness of the liner layer 42 is in a range from about 500 Å to about 2000 Å. In some embodiments, a thickness K4 of the first passivation layer 152 is greater than a thickness K3 of the liner layer 42. In some embodiments, a thickness of the first passivation layer 152 is in a range from about 8000 Å to about 20000 Å. In some embodiments, a thickness of the second passivation layer 154 is in a range from about 10000 Å to about 30000 Å. In some embodiments, a thickness of the third passivation layer 156 is in a range from about 10000 Å to about 30000 Å. In some embodiments, a thickness T5 of the passivation structure 150 is substantially larger than a thickness T6 of the protecting layer 162. The passivation structure 150 and the protecting layer 162 form a composite passivation layer. The protecting layer 162 is above the top surfaces of the UTM lines 36, thus without filling into the gap between the UTM lines 36.

In some embodiments, after the deposition of the first passivation layer 152 or the second passivation layer 154, the HDPCVD process for the deposition is halted to lower temperature of the UTM lines 36. A wafer 102 (may be also referred to as a substrate) may be transferred to a wafer handling chamber 336 as shown in FIG. 20 from the HDPCVD system 6 to lower temperature of the UTM lines 36. In some embodiments, the liner layer 42 and the first and second passivation layers 152 and 154 may experience different stresses under the manufacturing process which may generate crack between the liner layer 42 and the second passivation layer 54. Therefore, the transferring may be used to cool the UTM lines 36, so as to prevent the first and second passivation layers 152 and 154 from cracking due to the raised temperature of the UTM lines 36.

In some embodiments, the wafer 102 may be transferred to the load lock chamber 332, 334 or to outside the multi-chamber processing system 300 to lower temperature of the UTM lines 36. Therefore, the transferring may be used to cool the UTM lines 36, so as to prevent the first passivation layer 152 or the second passivation layer 154 from cracking due to the raised temperature of the UTM lines 36.

In some embodiments, the wafer 102 may be transferred to a treatment unit 421 connected to the multi-chamber processing system 300 or transferred to the FOUP system 430 to lower temperature of the UTM lines 36. Therefore, the transferring may be used to cool the UTM lines 36, so as to prevent the first passivation layer 152 or the second passivation layer 154 from cracking due to the raised temperature of the UTM lines 36.

In FIG. 15, an under bump metallurgy (UBM) layer 182 is formed over the protecting layer 162 and contacts the UTM line 36 from the recess of the passivation structure 50. A photoresist layer (not shown) is formed over a UBM layer 182 and developed to form a hole that exposes the UBM layer 182 and over the UTM line 36. The photoresist layer acts as a mold for metal deposition process for conductive pillar formation. Then, a conductive material is deposited, in some embodiments, in the hole by evaporation, electroplating, or screen printing to form a conductive pillar 192 over the UBM layer 182. After the removal of the photoresist layer, the UBM layer 182 not covered by the conductive pillar 192 is removed by an etching process that etches the exposed portions of the UBM layer 182 down to the underlying protecting layer 162.

Figure 16:
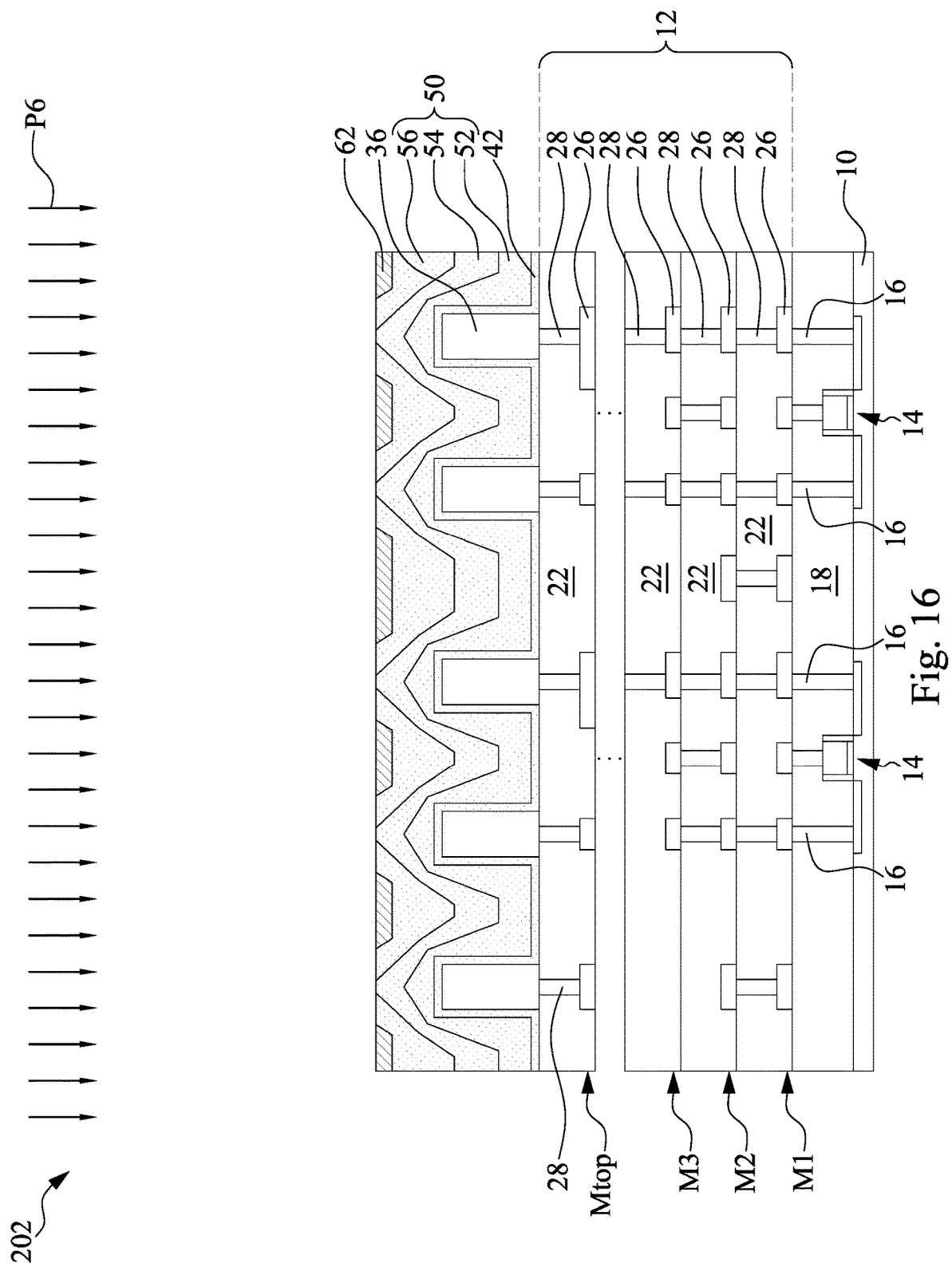
FIGS. 16-18 are cross-sectional views of a method for manufacturing an integrated circuit structure with passivation layers at various stages in accordance with some embodiments of the present disclosure.
Figure 17:
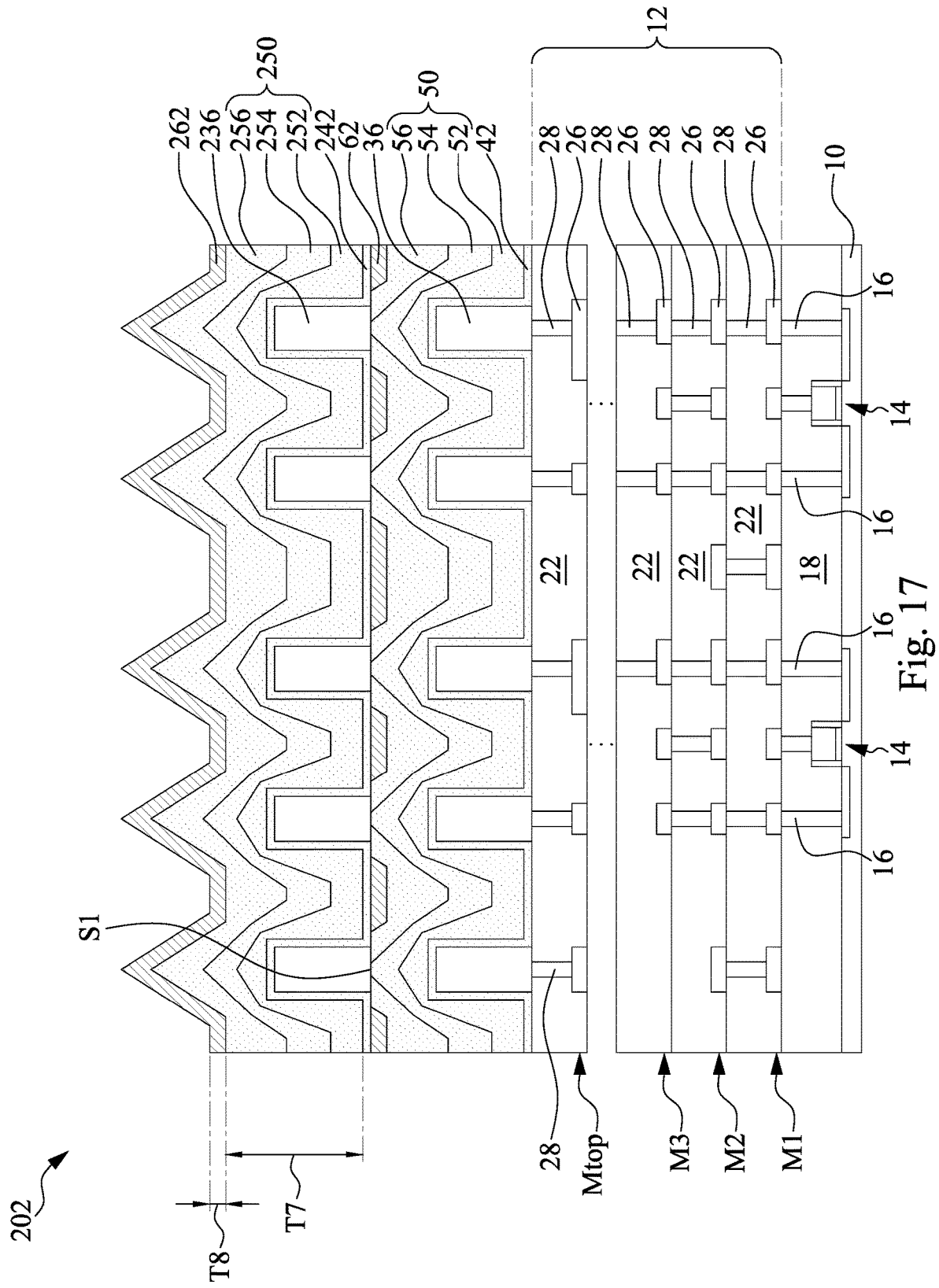
Figure 18:
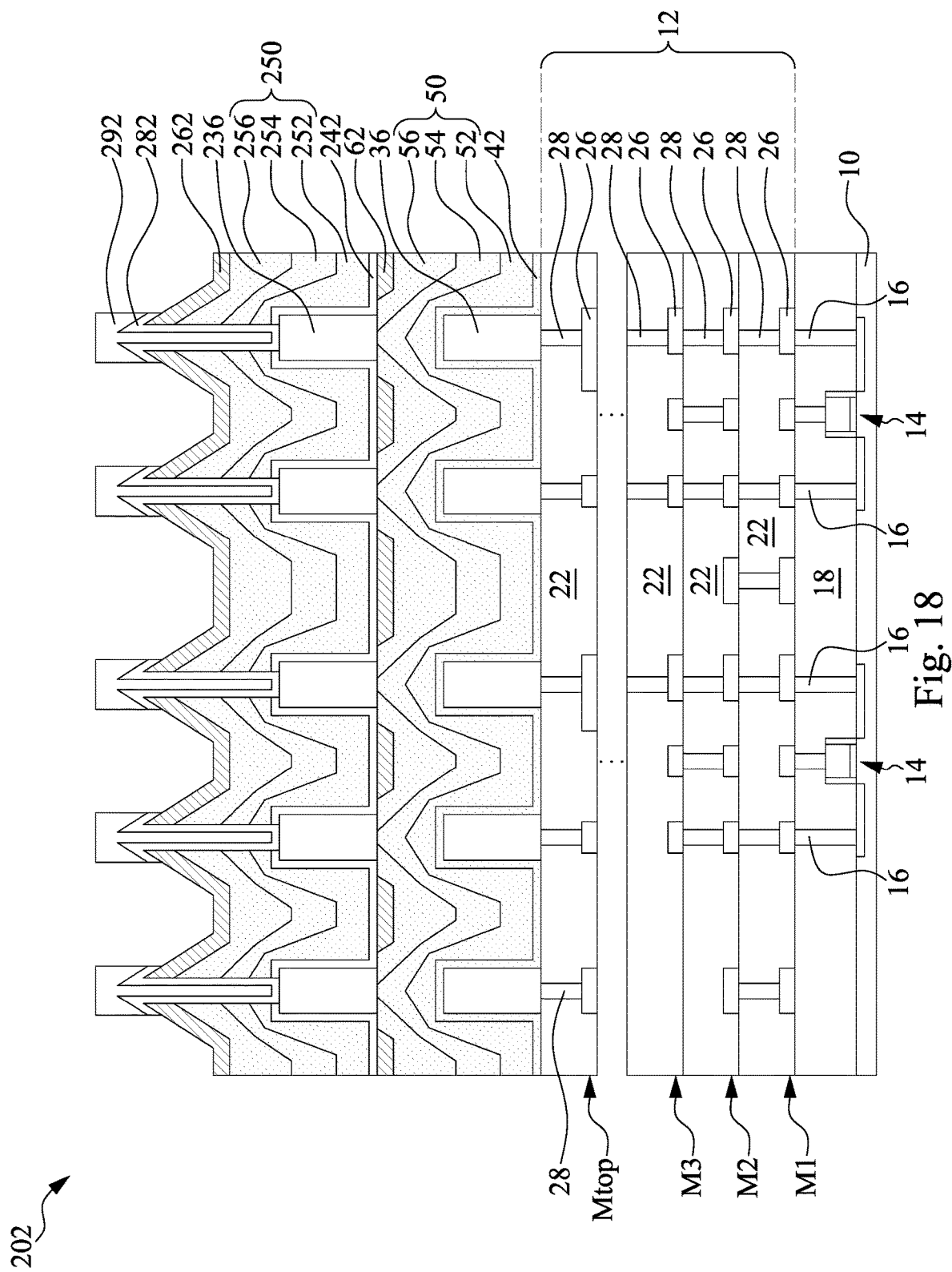

Reference is made to FIGS. 16-18. FIGS. 16-18 are cross-sectional views of a method for manufacturing an integrated circuit structure with passivation layers at various stages in accordance with some embodiments of the present disclosure. It should be pointed out that operations for forming a wafer 202 (may be also referred to as a substrate) with the integrated circuit structure before the structure shown in FIG. 16 are substantially the same as the operations for forming the wafer 2 shown in FIGS. 1A-8, and reference may be made to the foregoing paragraphs for the related detailed descriptions and such descriptions are not provided again herein. In some embodiments, the protecting layer 62 shown in FIGS. 8-13 may be omitted.

As shown in FIG. 16, a planarization process P6 is performed to the first, second, and third passivation layers 52, 54, and 56 and the protecting layer 62 to form a level top surface Si. In FIG. 16, portions of the second, and third passivation layers 54 and 56 and the protecting layer 62 are removed. In some embodiments, portions of the first, second, and third passivation layers 52, 54, and 56 and the protecting layer 62 are removed by a chemical mechanical polishing (CMP) process. In some embodiments, the second, and third passivation layers 54 and 56 and the protecting layer 62 are removed by an etching process. In some embodiments, the second, and third passivation layers 54 and 56 and the protecting layer 62 are removed by an etching process, for example, a dry etching process using plasma. Plasma etching may use source gases that include $H_2$ and $N_2$. In some embodiments, the plasma etching is the absence of fluorine compounds from the source gases. In some embodiments, the etching process uses a gas flow rate in the range from 5 to 1000 ml/min. In some embodiments, the etching process is carried out at a pressure ranging from 1 to 100 mTorr. In some embodiments, the etching process uses a plasma source at a power setting ranging from 200 to 5000 W. In some embodiments, the etching process uses bias power up to 500 W. In some embodiments, the etching process is carried out at a temperature ranging from 10 to 60° C.

As shown in FIG. 17, after the planarization process P6 is performed, other UTM lines 236, a liner layer 242, first, second, and third passivation layers 252, 254, and 256, and a protecting layer 262 are formed over the top surface Sl. In some embodiments, the forming of the UTM lines 236, the liner 242, first, second, and third passivation layers 252, 254, and 256, and the protecting layer 262 are substantially the same as the forming of the UTM line 36, the liner layer 42, first, second, and third passivation layers 52, 54, and 56, and the protecting layer 62 as shown in FIGS. 1A-8. In some embodiments, an entirety of the first, second, and third passivation layer 252, 254, and 256 may be referred to as a passivation structure 250. In some embodiments, the passivation structure 250 extends without an interface from the liner 242 to the protecting layer 262. In some embodiments, a thickness T7 of the passivation structure 250 is substantially larger than a thickness T8 of the protecting layer 262. In some embodiments, the first, second, and third passivation layers 252, 254, and 256 are more porous than the liner 242. In some embodiments, the first passivation layer 252 and the liner 242 form an interface therebetween.

In some embodiments, a thickness of the liner 242 is in a range from about 500 Å to about 2000 Å. In some embodiments, a thickness of the first passivation layer 252 is greater than a thickness of the liner 242. In some embodiments, a thickness of the first passivation layer 252 is in a range from about 8000 Å to about 20000 Å. In some embodiments, a thickness of the second passivation layer 254 is in a range from about 10000 Å to about 30000 Å. In some embodiments, a thickness of the third passivation layer 256 is in a range from about 10000 Å to about 30000 Å. In some embodiments, a thickness of the passivation structure 250 is substantially larger than a thickness of the protecting layer 262. The passivation structure 250 and the protecting layer 262 form a composite passivation layer.

In some embodiments, after the deposition of the first passivation layer 252 or the second passivation layer 254, the HDPCVD process for the deposition is halted to lower temperature of the UTM lines 236. The wafer 202 may be transferred to a wafer handling chamber 336 as shown in FIG. 20 from the HDPCVD system 6 to lower temperature of the UTM lines 236. In some embodiments, the liner 242 and the first and second passivation layers 252 and 254 may experience different stresses under the manufacturing process which may generate crack between the liner 242 and the first and second passivation layers 252 and 254. Therefore, the transferring may be used to cool the UTM lines 236, so as to prevent the first passivation layers 252 and 254 from cracking due to the raised temperature of the UTM lines 236.

In some embodiments, the wafer 202 may be transferred to the load lock chamber 332, 334 or to outside the multi-chamber processing system 300 to lower temperature of the UTM lines 236. Therefore, the transferring may be used to cool the UTM lines 236, so as to prevent the first passivation layer 252 or the second passivation layer 254 from cracking due to the raised temperature of the UTM lines 236.

In some embodiments, the wafer 202 may be transferred to a treatment unit 421 connected to the multi-chamber processing system 300 or transferred to the FOUP system 430 to lower temperature of the UTM lines 236. Therefore, the transferring may be used to cool the UTM lines 236, so as to prevent the first passivation layer 252 or the second passivation layer 254 from cracking due to the raised temperature of the UTM lines 236.

As shown in FIG. 18, an under bump metallurgy (UBM) layer 282 is formed over the protecting layer 262 and contacts the UTM line 236 from the recess of the passivation structure 250. A photoresist layer (not shown) is formed over a UBM layer 282 and developed to form a hole that exposes the UBM layer 282 and over the UTM line 236. The photoresist layer acts as a mold for metal deposition process for conductive pillar formation. Then, a conductive material is deposited, in some embodiments, in the hole by evaporation, electroplating, or screen printing to form a conductive pillar 292 over the UBM layer 282. After the removal of the photoresist layer, the UBM layer 282 not covered by the conductive pillar 292 is removed by an etching process that etches the exposed portions of the UBM layer 282 down to the underlying protecting layer 262.

According to the aforementioned embodiments, it can be seen that the present disclosure offers advantages in fabricating integrated circuit structures. It is understood, however, that other embodiments may offer additional advantages, and not all advantages are necessarily disclosed herein. One advantage is that a passivation structure between a liner and a protective layer that is over an Ultra-Thick Metal (UTM) has no interface therebetween, such that an entirety of the passivation structure may experience comparable stress during the manufacturing process, thus reducing risk of crack occurring in the passivation structure.

Another advantage is that after the deposition of a passivation layer over a liner by an HDPCVD process, the processes on the substrate may be halted to lower temperature of the UTM lines. In some embodiments, the liner and the passivation layer may experience different stresses during the manufacturing process which may generate crack between the liner and the first passivation layer. Therefore, the halting may be used to cool the UTM lines below the liner, so as to prevent the passivation layer and the liner from cracking due to the raised temperature of the UTM lines.

In some embodiments of the present disclosure, a method includes forming metal lines over an interconnect structure that is formed above transistors; depositing a liner layer over the metal lines using a first high density plasma chemical vapor deposition (HDPCVD) process with a zero RF bias power depositing a first passivation layer over the liner layer using a second HDPCVD process with a non-zero RF bias power; and depositing a second passivation layer in contact with a top surface of the first passivation layer using a third HDPCVD process with a non-zero RF bias power.

In some embodiments of the present disclosure, a method includes forming metal lines over an interconnect structure that is formed above transistors; depositing a liner oxide layer in contact with the metal lines; forming a passivation oxide structure in contact with a top surface of the liner layer, in which the liner layer is more porous than any position in the passivation oxide structure; and forming a protection nitride layer in contact with a top surface of the passivation oxide structure.

In some embodiments of the present disclosure, a method includes an interconnect structure, metal lines, a liner layer, a passivation structure, and a nitride layer. The interconnect structure is over transistors. The metal lines extend along a top surface of the interconnect structure. The liner layer is over the metal lines. The passivation structure is over the liner. The nitride layer is over the passivation structure, in which the passivation structure extends continuously without an interface from the liner layer to the nitride layer.

In some embodiments, an integrated circuit (IC) structure includes a substrate, a transistor, an interconnect structure, a plurality of metal lines, an oxide liner, a passivation layer, and a nitride layer. The transistor is on the substrate. The interconnect structure is over the transistor. The metal lines is on the interconnect structure. The oxide liner is over the plurality of metal lines. The passivation layer is over the oxide liner and is more porous than the passivation layer. The nitride layer is over the passivation layer. In some embodiments, the passivation layer is porous-free. In some embodiments, the passivation layer is made of a same material as the oxide liner. In some embodiments, the passivation layer is made of silicon oxide. In some embodiments, the passivation layer extends continuously without an interface therein. In some embodiments, the passivation layer is in contact with the oxide liner. In some embodiments, the passivation layer has a thicker thickness than the oxide liner. In some embodiments, the passivation layer has a thickness in a range from about 8000 Å to about 20000 Å. In some embodiments, the oxide liner has a thickness in a range from about 500 Å to about 2000 Å. In some embodiments, the IC structure further includes a conductive pillar penetrating through the nitride layer, the passivation layer, and the oxide liner and landing on one of the plurality of metal lines.

In some embodiments, an integrated circuit (IC) structure includes a semiconductor substrate, a plurality of first metal lines, a plurality of second metal lines, an oxide liner, and a passivation structure. The first metal lines laterally extend above the semiconductor substrate. The second metal lines laterally extend above the plurality of first metal lines, and the second metal lines each having a thickness about five times greater than a thickness of a topmost one of the plurality of first metal lines. The oxide liner is over the plurality of second metal lines. The passivation structure is over the oxide liner and having no interface therein. In some embodiments, the oxide liner is more porous than the passivation layer. In some embodiments, the passivation structure and the oxide liner form an interface therebetween. In some embodiments, the passivation structure is made of a same material as the oxide liner. In some embodiments, the passivation structure has a thicker thickness than the oxide liner. In some embodiments, the IC structure further includes a nitride layer extends along a top surface of the passivation structure.

In some embodiments, an integrated circuit (IC) structure includes a semiconductor substrate, an interconnect structure, a plurality of metal lines, a porous liner, a porous-free passivation layer, and a nitride layer. The interconnect structure is over the semiconductor substrate. The metal lines are on the interconnect structure. The porous liner is over the plurality of metal lines. The porous-free passivation layer is over the porous liner. The nitride layer is over the porous-free passivation layer. In some embodiments, the porous-free passivation layer is made of a same material as the porous liner. In some embodiments, the porous-free passivation layer has a thicker thickness than the porous liner. In some embodiments, the IC structure further includes a conductive pillar penetrating through the nitride layer, the porous-free passivation layer, and the porous liner and landing on one of the plurality of metal lines.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit (IC) structure, comprising:
   a substrate;
   a transistor on the substrate;
   an interconnect structure over the transistor;
   a plurality of metal lines on the interconnect structure;
   an oxide liner over the plurality of metal lines;
   a passivation layer over the oxide liner, the oxide liner being more porous than the passivation layer; and
   a nitride layer over the passivation layer.

2. The IC structure of claim 1, wherein the passivation layer is porous-free.

3. The IC structure of claim 1, wherein the passivation layer is made of a same material as the oxide liner.

4. The IC structure of claim 1, wherein the passivation layer is made of silicon oxide.

5. The IC structure of claim 1, wherein the passivation layer extends continuously without an interface therein.

6. The IC structure of claim 1, wherein the passivation layer is in contact with the oxide liner.

7. The IC structure of claim 1, wherein the passivation layer has a thicker thickness than the oxide liner.

8. The IC structure of claim 1, wherein the passivation layer has a thickness in a range from about 8000 Å to about 20000 Å.

9. The IC structure of claim 1, wherein the oxide liner has a thickness in a range from about 500 Å to about 2000 Å.

10. The IC structure of claim 1, further comprising:
    a conductive pillar penetrating through the nitride layer, the passivation layer, and the oxide liner and landing on one of the plurality of metal lines.

11. An integrated circuit (IC) structure, comprising:
    a semiconductor substrate;
    a plurality of first metal lines laterally extending above the semiconductor substrate;
    a plurality of second metal lines laterally extending above the plurality of first metal lines, the plurality of second metal lines each having a thickness about five times greater than a thickness of a topmost one of the plurality of first metal lines;
    an oxide liner over the plurality of second metal lines; and
    a passivation structure over the oxide liner and having no interface therein.

12. The IC structure of claim 11, wherein the oxide liner is more porous than the passivation layer.

13. The IC structure of claim 11, wherein the passivation structure and the oxide liner form an interface therebetween.

14. The IC structure of claim 11, wherein the passivation structure is made of a same material as the oxide liner.

15. The IC structure of claim 11, wherein the passivation structure has a thicker thickness than the oxide liner.

16. The IC structure of claim 11, further comprising a nitride layer extends along a top surface of the passivation structure.

17. An integrated circuit (IC) structure, comprising:
    a semiconductor substrate;
    an interconnect structure over the semiconductor substrate;
    a plurality of metal lines on the interconnect structure;
    a porous liner over the plurality of metal lines;
    a porous-free passivation layer over the porous liner; and
    a nitride layer over the porous-free passivation layer.

18. The IC structure of claim 17, wherein the porous-free passivation layer is made of a same material as the porous liner.

19. The IC structure of claim 17, wherein the porous-free passivation layer has a thicker thickness than the porous liner.

20. The IC structure of claim 17, further comprising:
    a conductive pillar penetrating through the nitride layer, the porous-free passivation layer, and the porous liner and landing on one of the plurality of metal lines.

* * * * *